(12) United States Patent
Yamoto et al.

(10) Patent No.: US 6,709,512 B2
(45) Date of Patent: Mar. 23, 2004

(54) METHOD OF GROWING A POLYCRYSTALLINE SILICON LAYER, METHOD OF GROWING A SINGLE CRYSTAL SILICON LAYER AND CATALYTIC CVD APPARATUS

(75) Inventors: Hisayoshi Yamoto, Kanagawa (JP); Hideo Yamanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 98 days.

(21) Appl. No.: 09/941,530

(22) Filed: Aug. 29, 2001

(65) Prior Publication Data

US 2002/0104477 A1 Aug. 8, 2002

(30) Foreign Application Priority Data

Aug. 30, 2000 (JP) ...................... P2000-261396

(51) Int. Cl.$^7$ .............................. C30B 29/16
(52) U.S. Cl. ........................... 117/90; 117/94; 117/101; 117/105; 117/935; 118/715; 118/722; 427/255.11; 427/255.12; 427/255.27
(58) Field of Search .............................. 117/90, 94, 101, 117/105, 935; 427/255.11, 255.18, 255.27; 118/715, 722

(56) References Cited

U.S. PATENT DOCUMENTS 5,840,631 A    11/1998   Kubo et al.

FOREIGN PATENT DOCUMENTS

JP           56-025018       *  6/1981

OTHER PUBLICATIONS

Matsumura, "Formation of Silicon–Based Thin Films Prepared by Catalytic Chemical Vpro Deposition (cat–CVD) Method", Japanese Journal of Applied Physics vol 37 Part 1 No. 6a (1988) pp. 3175–3187.*
Patent Abstracts of Japan JP63040314A2.
Patent Abstracts of Japan JP8250438A2.

* cited by examiner

Primary Examiner—Robert Kunemund
(74) Attorney, Agent, or Firm—Robert J. Depke; Holland & Knight LLP

(57) ABSTRACT

When a polycrystalline or single crystal silicon layer is grown by catalytic CVD, a catalyst having a nitride covering at least its surface is used. In case that tungsten is used as the catalyst, tungsten nitride is formed as the nitride. The nitride is made by heating the surface of the catalyst to a high temperature around 1600 to 2100° C. in an atmosphere containing nitrogen prior to the growth. When the catalyst is heated to the temperature for its use or its nitrification, it is held in a hydrogen atmosphere.

57 Claims, 20 Drawing Sheets

METHOD OF GROWING A POLYCRYSTALLINE SILICON LAYER, METHOD OF GROWING A SINGLE CRYSTAL SILICON LAYER AND CATALYTIC CVD APPARATUS

RELATED APPLICATION DATA

The present application(s) claim(s) priority to Japanese Application(s) No(s). P2000-261396 filed Aug. 30, 2000, which application(s) is/are incorporated herein by reference to the extent permitted by law.

BACKGROUND OF THE INVENTION

1. Field of the Invention

This invention relates to a method of growing a polycrystalline silicon layer, a method of epitaxially growing a single crystal silicon layer, and a catalytic CVD apparatus, which are suitable for manufacturing, for example, a thin-film transistor (TFT).

2. Description of the Related Art

For fabricating a polycrystalline silicon (Si) layer, typically used heretofore was a method using atmospheric pressure chemical vapor deposition (APCVD) to decompose silane ($SiH_4$) or disilane ($Si_2H_6$) under a temperature around 600 to 700° C., in hydrogen atmosphere and under the pressure of $1\times10^5$ Pa (760 Torr) and thereby grow the layer, a method using low-pressure chemical vapor deposition (LPCVD) to decompose and grow silane ($SiH_4$) or disilane ($Si_2H_6$) under a temperature around 600 to 700° C., in hydrogen atmosphere and under the pressure of $(0.53\sim1.33)\times10^2$ Pa (0.4~1 Torr) and thereby grow the layer, or a method using plasma CVD to decompose silane ($SiH_4$) or disilane ($Si_2H_6$) under a temperature around 200 to 400° C., in a hydrogen atmosphere and under the pressure of $(0.26\sim2.6)\times10^2$ Pa (0.2~2 Torr), thereby grow an amorphous silicon layer and thereafter anneal the amorphous silicon layer under a high temperature around 800 to 1300° C. so as to grow crystal grains.

However, those methods for growing polycrystalline silicon layers by APCVD and LPCVD involve the problem that their growth temperatures are high. In APCVD and LPCVD, since all of the energy required for chemical interaction and growth during growth of polycrystalline silicon layers is supplied in form of heat energy by heating, the growth temperature cannot be largely decreased from about 600° C. Additionally, since interaction efficiency of reactant gas like silane is generally as low as several t or less, almost all of such reactant gas is discharged and discarded, cost of reactant gas becomes high and cost required for the discard is also high. On the other hand, the method for fabricating a polycrystalline silicon layer by crystallizing an amorphous silicon layer involves the problem that it additionally needs an annealing apparatus for high-temperature annealing.

Recently, as a growth method of polycrystalline silicon layers overcoming those problems, a growth method called catalytic CVD are being remarked (for example, Japanese Laid-Open Publication No. sho 63-40314, Japanese Patent Laid-Open Publication No. hei 8-250438, Japanese Patent Laid-Open Publication No. hei 10-83988 and Applied Physics, Vol. 66, No. 10, p. 1094(1997)). This catalytic CVD uses catalytic cracking reaction between a heated catalyst and reactant gas (source material gas). Catalytic CVD, in its first stage, brings reactant gas (such as silane and hydrogen in case of using silane as the source material of silicon) into contact with a hot catalyst heated to 1600 through 1800° C., for example, to activate the reactant gas and thereby make silicon atoms, or clusters of silicon atoms, and hydrogen atoms, or clusters of hydrogen atoms, having high energies, and in its second stage, raises the temperature of these silicon atoms and hydrogen atoms or molecules having high energies, or a substrate that supplies their clusters, to a high temperature, thereby to supply and support the energy required particularly for silicon atoms to form single-crystal grains. Therefore, catalytic CVD enables growth of a polycrystalline silicon layer even at a lower temperature than those of conventional APCVD and LPCVD, such as around 350° C., for example.

However, according to results of various experiments made by the Inventor, in the case where a polycrystalline silicon layer is grown at a low temperature by existing catalytic CVD, metal impurities more easily enter into the growth layer than in growth layers grown by conventional APCVD and LPCVD, and containment of high-concentrated metal impurities in the resultant polycrystalline silicon layer is a problem this technique involves. These contained metal impurities amount to, for example, $2\times10^{17}\sim2\times10^{18}$ atoms/cc, of tungsten (W), $7\times10^{15}\sim2\times10^{17}$ atoms/cc of iron (Fe), $9\times10^{14}\sim3\times10^{16}$ atoms/cc of chromium (Cr), and less than $3\times10^{18}$ atoms/cc of nickel(Ni). In contrast, concentrations of metal impurities contained in a polycrystalline silicon layer grown by conventional APCVD or LPCVD are less than $1\times10^{15}$ atoms/cc of W, typically around $5\times10^{16}$ atoms/cc of Fe, typically less than $3\times10^{14}$ atoms/cc of Cr, and typically less than $6\times10^{19}$ atoms/cc of Ni. Thus it is recognized how high the concentration of metal impurities contained in the polycrystalline silicon layer grown at a low temperature by catalytic CVD. Polycrystalline silicon layers containing metal impurities to a high concentration exhibit bad electric properties, such as having a low electron mobility, and when they are used as polycrystalline silicon layers for TFT, for example, it is difficult to operate the TFT at a high speed.

OBJECTS AND SUMMARY OF THE INVENTION

It is therefore an object of the invention to provide a polycrystalline silicon layer growth method that can grow a polycrystalline silicon layer remarkably low in concentration of metal impurities contained therein.

Another object of the invention is to provide a single crystal layer epitaxial growth method that can epitaxially grow a single crystal silicon layer remarkably low in concentration of metal impurities contained therein.

Still another object of the invention is to provide a catalytic CVD apparatus that can grow a polycrystalline silicon layer and a single crystal silicon layer remarkably low in concentration of metal impurities contained therein.

The Inventor made researches toward solution of the above problems involved in conventional techniques. These researches are outlined below.

According to the Inventor's researches, it is considered that W, Fe, Cr and Ni contained in polycrystalline silicon layers grown by conventional catalytic CVD derived exclusively from catalysts. Among them, W is the component element of a catalyst itself whereas Fe, Cr and Ni are considered to have been contained as impurities in the W material. W has a very high melting point as high as 3380° C. and a low vapor pressure, its amount taken into the growth layer is not considered to be so much. Actually, however, since oxidizing substances like $O_2$ and $H_2O$ exist in the growth chamber of the catalytic CVD apparatus, W forming the catalyst will be oxidized to tungsten oxide when the catalyst is heated to a high, and tungsten oxide having a high vapor pressure will vaporize and will be taken into the growth layer.

Through various experiments, the Inventor reached the conclusion that, in order to prevent or minimize ingestion of metal impurities into a growth layer, it would be most effective to form a barrier layer on the surface of the catalyst to prevent separation of disengagement of component elements or impurities from the catalyst when it is heated to a high temperature for growth and that a carbide or a carbide would be preferable as the barrier layer from the viewpoint of heat resistance and easiness of its formation. It is sufficient for the barrier layer to exist on the surface of the catalyst at least upon the start of growth. It may be previously formed before placing the catalyst in the catalytic CVD apparatus, or may be formed before the growth is started after the catalyst is placed in the catalytic CVD apparatus.

The present invention has been made as a result of researches based on the Inventor's own knowledge.

According to the first aspect of the invention, there is provided a polycrystalline silicon layer growth method for growing a polycrystalline silicon layer on a substrate by catalytic CVD, characterized in:

the polycrystalline silicon layer being grown by using a catalyst having a nitride that forms at least the surface thereof.

According to the second aspect of the invention, there is provided a single crystal silicon layer epitaxial growth method for epitaxially growing a single crystal silicon layer on a material layer in lattice alignment with the single crystal by catalytic CVD, characterized in:

the polycrystalline silicon layer being epitaxially grown by using a catalyst having a nitride that forms at least the surface thereof.

According to the third aspect of the invention, there is provided a catalytic CVD apparatus using a catalyst, characterized in:

said catalyst having a nitride at least on the surface thereof.

In the first, second and third aspects of the invention, the nitride on the surface of the catalyst may be thick enough to prevent component elements or impurities from separating or disengaging externally at the temperature for using the catalyst. More specifically, a thickness not smaller than 1 nm is sufficient as the thickness of the nitride although it depends on the adhesiveness of the nitride with its base and the film quality of the nitride as well. For more reliable prevention of external separation of component elements or impurities from the catalyst, thickness of the nitride is preferably 5 nm or more, or more preferably not less than 10 nm. The nitride is typically made by nitrifying the surface of the catalyst before conducting the growth. Nitrification is normally conducted by heating the catalyst in an atmosphere of a gas containing nitrogen. In case a catalyst of tungsten, for example, is used, since the tungsten nitride formed on the surface of the catalyst of tungsten at a high temperature may suffer local cracks or exfoliation when the temperature of the catalyst decreases, for the purpose of preventing tungsten from oxidization and vaporization from cracks or portions of exfoliation, tungsten nitride is preferably formed on the surface of the catalyst immediately before the growth of the silicon layer. In case the surface of a catalyst of tungsten, for example, is nitrified, if nitrification is conducted at a temperature between 400° C. and 770° C., there occur disadvantages including an increase of the resistance value caused by nitrification of not only the surface of the catalyst but also the entirety. Therefore, the catalyst of tungsten is preferably heated in a gas atmosphere containing nitrogen to a temperature in the range from 800° C. to 2200° C., more preferably in the range from 800° C. to 2200° C., or more preferably in the range from 1600° C. to 2100° C. or in the range from 1700° C. to 1900° C. In these temperature ranges, a good-quality nitride can be formed at a practical speed. The gas containing nitrogen may be, for example, ammonium ($NH_3$), nitrogen ($N_2$) or hydrazine ($N_2H_4$). Upon heating the catalyst to the temperature for its use or the nitrification temperature, the catalyst is desirably held in a hydrogen atmosphere for the purpose of preventing oxidization by oxidizing components existing in the atmosphere. On the other hand, in case the catalyst of tungsten is nitrified after raising the temperature to the range from 1700° C. to 1900° C., since a slight amount of oxidizing components existing in the growth chamber may oxidize and evaporate tungsten and may stack tungsten on the substrate surface for growing the silicon layer on, for the purpose of preventing it, nitrification is conducted by first heating the catalyst of tungsten to a first temperature in the range from 800° C. to 1600° C. in a hydrogen atmosphere, for example, and thereafter heating the catalyst of tungsten to a second temperature in the range from 900° C. to 2200° C. in a gas atmosphere containing nitrogen. More preferably, the first temperature is in the range from 900° C. to 1100° C. whereas the second temperature is in the range from 1200° C. to 2200° C. More preferably, the first temperature is in the range from 900° C. to 1100° C. (typically around 1000° C.) whereas the second temperature is in the range from 1600° C. to 2100° C.

By growing a polycrystalline silicon layer or a single crystal silicon layer by catalytic CVD using a catalyst of tungsten having formed a nitride on the surface thereof, for example, the maximum tungsten concentration in the polycrystalline silicon layer or the single crystal silicon layer can be controlled to $5 \times 10^{16}$ atoms/cm$^3$ or less.

The nitride may be formed by stacking a nitride on the surface of the catalyst, instead of forming it by nitrifying the surface of the catalyst. For stacking the nitride, sputtering, metal-organic chemical vapor deposition (MOCVD), or other like method, for example, can be used.

On the other hand, in order to reduce the concentration of contained oxygen in addition to the concentration of the contained metal impurities in the polycrystalline silicon layer or single crystal silicon layer grown by catalytic CVD, it is effective to adjust the total pressure of the growth atmosphere to a value in the range from $1.33 \times 10^{-3}$ Pa to 4 Pa at least at the beginning of the growth, or adjust the partial pressure of oxygen and moisture in the growth atmosphere to a value in the range from $6.65 \times 10^{-10}$ Pa to $2 \times 10^{-6}$ Pa at least at the beginning of the growth. By adjusting the total pressure of the growth atmosphere or the partial pressure of oxygen and moisture to a value in the above-indicated ranges, ingestion of oxygen to the growth layer can be reduced significantly. As a result, in case of a polycrystalline silicon layer, the maximum oxygen concentration of a portion at least 10 nm deep from the boundary between the substrate and the polycrystalline silicon layer can be reduced to a value not higher than $5 \times 10^{18}$ atoms/cm$^3$, or $2.5 \times 10^{18}$ atoms/cm$^3$ in some cases. Alternatively, the maximum oxygen concentration of a portion at least 50 nm deep from the boundary between the substrate and the polycrystalline silicon layer can be reduced to a value not higher than $5 \times 10^{18}$ atoms/cm$^3$. Alternatively, the maximum oxygen concentration of a portion at least 100 nm deep from the boundary between the substrate and the polycrystalline silicon layer can be reduced to a value not higher than $5 \times 10^{18}$ atoms/cm$^3$. In case a single crystal silicon layer, the maximum oxygen concentration of a portion at least 10 nm deep from the boundary between the material layer and the single crystal silicon layer can be reduced to a value not higher than $3 \times 10^{18}$ atoms/cm$^3$, or $2 \times 10^{18}$ atoms/cm$^3$ in some cases. Alternatively, the maximum oxygen concentration of a portion at least 50 nm deep from the boundary between the material layer and the single crystal silicon layer can be reduced to a value not higher than $3 \times 10^{18}$ atoms/cm$^3$. Alternatively, the maximum oxygen concentration of a portion at least 100 nm deep from the boundary between the material layer and the polycrystalline silicon layer can be reduced to a value not higher than $3 \times 10^{18}$ atoms/cm$^3$. If the thickness of the single crystal silicon layer is 1 μm or less, the maximum oxygen concentration can be reduced to a value not higher than $3 \times 10^{18}$ atoms/cm$^3$. If the thickness of the single crystal silicon layer is 100 nm or less, then the maximum oxygen concentration can be reduced to a value not higher than $2 \times 10^{18}$ atoms/cm$^3$.

According to the fourth aspect of the invention, there is provided a polycrystalline silicon layer growth method for growing a polycrystalline silicon layer on a substrate by catalytic CVD, characterized in:

the polycrystalline silicon layer being grown by using a catalyst having a carbide that forms at least the surface thereof.

According to the fifth aspect of the invention, there is provided a single crystal silicon layer epitaxial growth method for epitaxially growing a single crystal silicon layer on a material layer in lattice alignment with the single crystal by catalytic CVD, characterized in:

the polycrystalline silicon layer being epitaxially grown by using a catalyst having a carbide that forms at least the surface thereof.

According to the sixth aspect of the invention, there is provided a catalytic CVD apparatus using a catalyst, characterized in:

the catalyst having a carbide at least on the surface thereof.

In the fourth, fifth and sixth aspects of the invention, the carbide on the surface of the catalyst may be thick enough to prevent component elements or impurities from separating or disengaging externally at the temperature for using the catalyst. More specifically, a thickness not smaller than 1 nm is sufficient as the thickness of the carbide although it depends on the adhesiveness of the carbide with its base and the film quality of the carbide as well. For more reliable prevention of external separation of component elements or impurities from the catalyst, thickness of the carbide is preferably 5 nm or more, or more preferably not less than 10 nm. The carbide is typically made by carbonizing the surface of the catalyst before conducting the growth. Carbonization is normally conducted by heating the catalyst in an atmosphere of a gas containing carbon. In case a catalyst of tungsten, for example, is used, since the tungsten carbide formed on the surface of the catalyst of tungsten at a high temperature may suffer local cracks or exfoliation when the temperature of the catalyst decreases, for the purpose of preventing tungsten from oxidization and vaporization from cracks or portions of exfoliation, tungsten carbide is preferably formed on the surface of the catalyst immediately before the growth of the silicon layer. In case the surface of a catalyst of tungsten, for example, is carbonized, if carbonization is conducted at a temperature between 400° C. and 770° C., there occur disadvantages including an increase of the resistance value caused by carbonization of not only the surface of the catalyst but also the entirety. Therefore, the catalyst of tungsten is preferably heated in a gas atmosphere containing carbon to a temperature in the range from 800° C. to 2200° C., more preferably in the range from 800° C. to 2200° C., or more preferably in the range from 1600° C. to 2100° C. or in the range from 1700° C. to 1900° C. In these temperature ranges, a good-quality carbide can be formed at a practical speed. The gas containing carbon may be, for example, methane (NH$_4$). Upon heating the catalyst to the temperature for its use or the nitrification temperature, the catalyst is desirably held in a hydrogen atmosphere for the purpose of preventing oxidization by oxidizing components existing in the atmosphere. On the other hand, in case the catalyst of tungsten is carbonized after raising the temperature to the range from 1700° C. to 1900° C., since a slight amount of oxidizing components existing in the growth chamber may oxidize and evaporate tungsten and may stack tungsten on the substrate surface for growing the silicon layer on, for the purpose of preventing it, carbonization is conducted by first heating the catalyst of tungsten to a first temperature in the range from 800° C. to 1600° C. in a hydrogen atmosphere, for example, and thereafter heating the catalyst of tungsten to a second temperature in the range from 900° C. to 2200° C. in a gas atmosphere containing carbon. More preferably, the first temperature is in the range from 900° C. to 1100° C. whereas the second temperature is in the range from 1200° C. to 2200° C. More preferably, the first temperature is in the range from 900° C. to 1100° C. (typically around 1000° C.) whereas the second temperature is in the range from 1600° C. to 2100° C.

By growing a polycrystalline silicon layer or a single crystal silicon layer by catalytic CVD using a catalyst of tungsten having formed a carbide on the surface thereof, for example, the maximum tungsten concentration in the polycrystalline silicon layer or the single crystal silicon layer can be controlled to $5 \times 10^{16}$ atoms/cm$^3$ or less.

The carbide may be formed by stacking a carbide on the surface of the catalyst, instead of forming it by nitrifying the surface of the catalyst. For stacking the carbide, sputtering, metal-organic chemical vapor deposition (MOCVD), or other like method, for example, can be used.

In order to reduce the concentration of contained oxygen in addition to the concentration of the contained metal impurities in the polycrystalline silicon layer or single crystal silicon layer grown by catalytic CVD, it is effective to adjust the total pressure of the growth atmosphere to a value in the range from $1.33 \times 10^{-3}$ Pa to 4 Pa at least at the beginning of the growth, or adjust the partial pressure of oxygen and moisture in the growth atmosphere to a value in the range from $6.65 \times 10^{-10}$ Pa to $2 \times 10^{-6}$ Pa at least at the beginning of the growth.

In the present invention, usable catalyst materials include, as simplex metals, tungsten (W) (3380° C.), titanium (Ti) (1668° C.), vanadium (V) (1905° C.), zirconium (Zr) (1850° C.), niobium (Nb) (2468° C.), molybdenum (Mo) (2615° C.), technetium (Tc) (2170° C.), ruthenium (Ru) (2280° C.), tantalum (Ta) (2998° C.), rhenium (Re) (3160° C.), osmium (Os) (3027° C.), and iridium (Ir) (2443° C.), for example. Temperatures after respective materials are their melting points. Usable materials other than simplex metals (alloys and compounds) include TaN, TaC, W$_2$N, WN, NiW, NiWN, TiW, TiWN, and MoNi. As carbides, there are TaC, WC, TiWc.

In the present invention, growth temperature of a polycrystalline silicon layer or a single crystal silicon layer by catalytic CVD may be in the range from 200° C. to 600° C.

In the second and fifth aspects of the invention, the base layer for epitaxially growing the single crystal silicon layer on, i.e. the material layer in lattice alignment with single crystal silicon, may be made of single crystal silicon, or sapphire, spinel, or the like. The "single crystal silicon" is used to involve those including sub-boundaries.

The growth method by catalytic CVD according to the invention can be used for manufacturing various types of semiconductor devices such as junction type FET and bipolar transistors in addition to thin-film transistors (TFT) that are MISFET, for example. Further, the method is applicable also to fabrication of diodes, capacitors and resistors, not limited to those transistors.

According to the invention having the above summarized configuration, since at least the surface of the catalyst is made up of a nitride or carbide, its component elements or metal impurities can be prevented from the catalyst when it is heated to a high temperature. Therefore, it is effectively prevented that these component elements or metal impurities are ingested into the growth layer while the a polycrystalline silicon layer or a single crystal silicon layer is grown by catalytic CVD.

Furthermore, by adjusting the total pressure of the growth atmosphere in the range from $1.33 \times 10^{-3}$ Pa to 4 Pa at least at the beginning of the growth, it is possible to maintain the partial pressure of oxygen and moisture in the growth atmosphere in the range from $6.65 \times 10^{-10}$ Pa to $2 \times 10^{-6}$ Pa at least at the beginning of the growth and to remarkably reduce the ingestion of oxygen into the growth layer.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Some embodiments of the invention will now be explained below with reference to the drawings.

Figure 1:
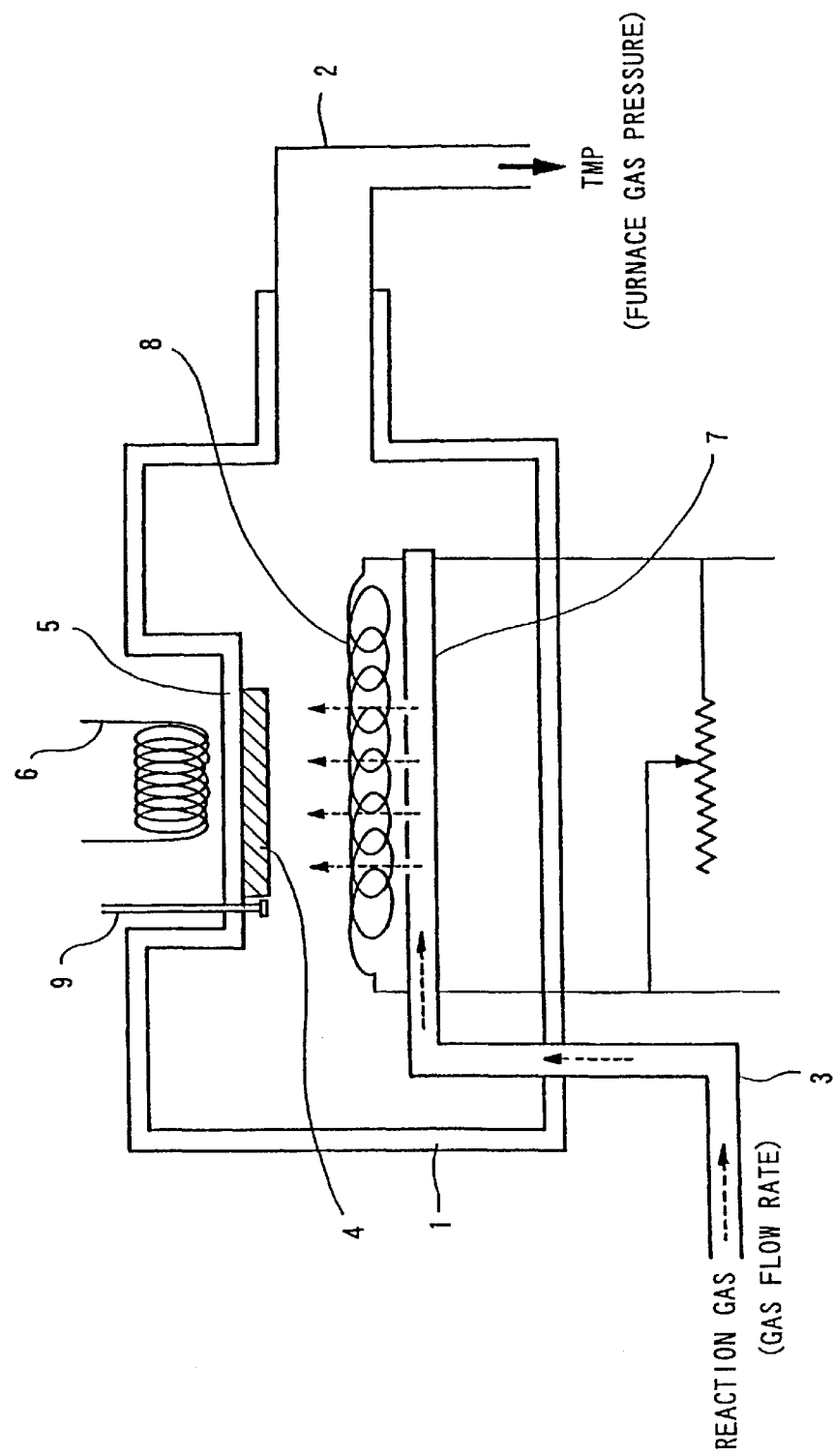
FIG. 1 is a schematic diagram that shows a catalytic CVD apparatus used for growth of a silicon layer in some embodiments of the invention.

First explained is a catalytic CVD apparatus used for growth of a polycrystalline silicon layer or a single crystal silicon layer in some embodiments explained later. FIG. 1 shows an example of catalytic CVD apparatus.

As shown in FIG. 1, the catalytic CVD apparatus includes a growth chamber 1 having a side wall to which a turbo molecular pump (TMP) is connected by an evacuation pipe 2. The growth chamber 1 can be evacuated by this TMP to a pressure around $1 \times 10^{-6}$ Pa, for example. At the bottom portion of the growth chamber 1, a gas supply pipe 3 is attached to supply reactant gas used for growth through the gas supply pipe 3 into the growth chamber 1. A substrate 4 for growing a polycrystalline silicon layer thereon is set to a sample holder portion 5 provided in an upper center inside the growth chamber 1 via a loadlock chamber, not shown. The sample holder portion 5 may be a graphite susceptor coated with SiC, for example, and can be heated by a heater 6 from the atmospheric air side. The sample holder portion 5 may be a graphite susceptor coated with SiC, for example, and can be heated by a heater 6 from the atmospheric air side. A catalyst 8 is placed between a gas blow-out nozzle 7 at the tip of the gas supply pipe 3 and the sample holder portion 5. Temperature of the substrate 4 can be measured by a thermocouple 9 attached to one side of the substrate 4 of the sample holder portion 5.

Figure 2:
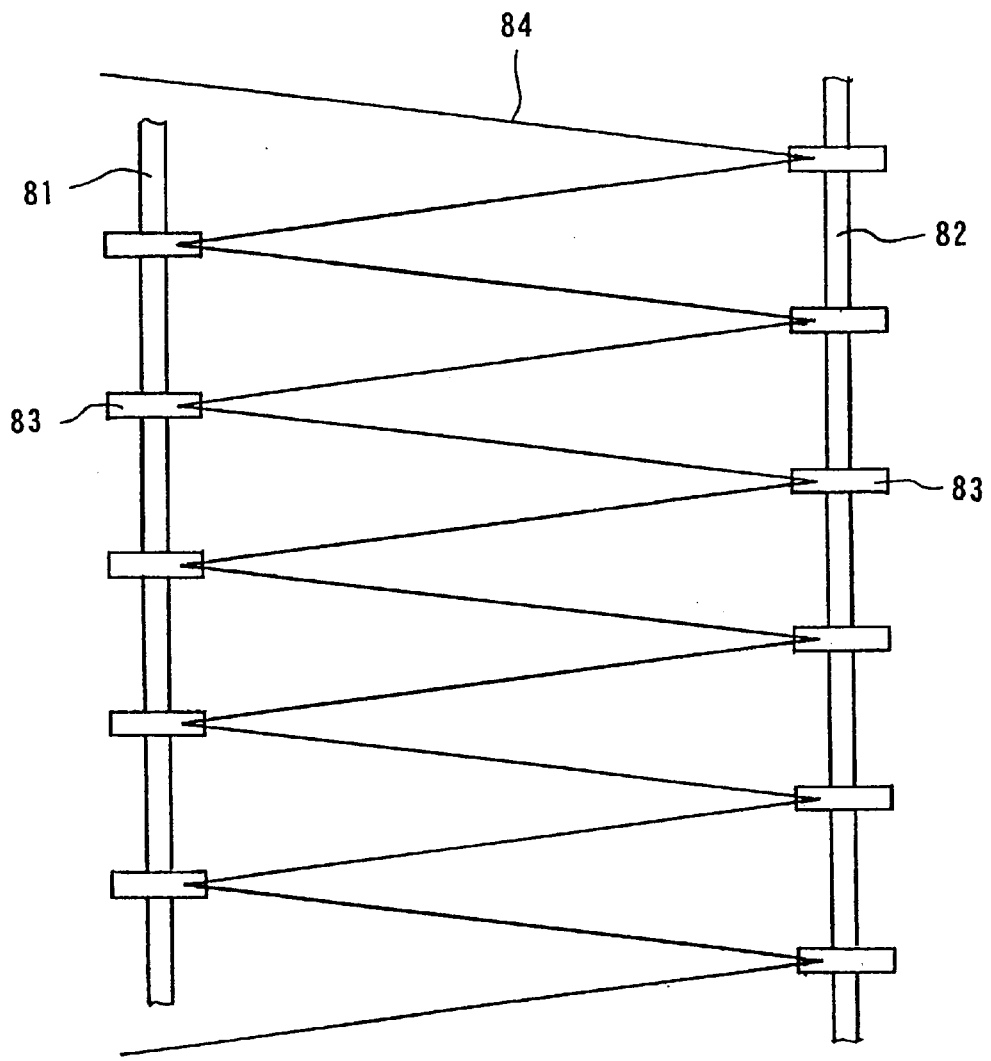
FIG. 2 is a schematic diagram that shows a catalytic CVD apparatus used for growth of a silicon layer in some embodiments of the invention.
Figure 3:
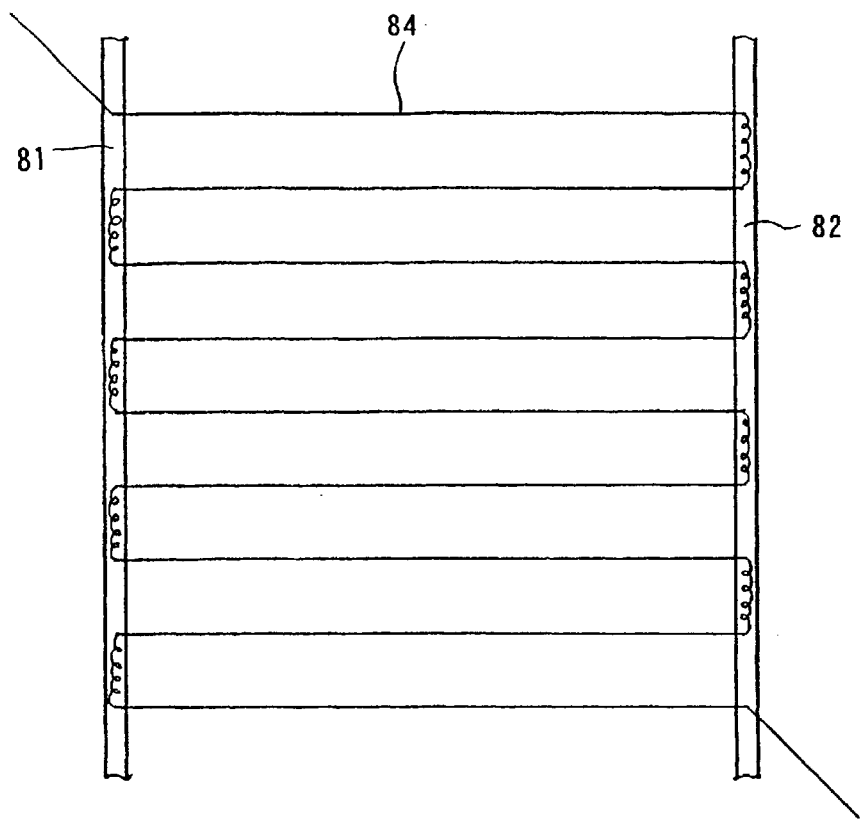
FIG. 3 is a schematic diagram that shows another catalytic CVD apparatus used for growth of a silicon layer in some embodiments of the invention.

Usable as the catalyst 8 is one made by winding W wire in form of a coil, then reciprocally extending the coil-shaped W wire to span over an area sufficient for covering the entirety of the substrate 4 such that the spanning surface extends in parallel with the plane of the sample holder 5. Alternatively, the catalyst 8 may be formed as shown in FIG. 2 by using a fixing member 83 made of Mo, for example, attached to two quartz rods 81, 82 held in parallel and reciprocally bridging the quartz rods 81, 82 with W wire 84 in a zigzag fashion to span over an area sufficient for covering the entirety of the substrate 4, with the spanning plane extending in parallel to the plane of the sample holder 5. Alternatively, the catalyst 8 may be formed as shown in FIG. 3 by bridging two quartz rods 81, 82 held in parallel with W wire 84 vertically to the quartz rods 81, 82 so as to make a serial connection as a whole, such that the W wire 84 makes a plane spanning over the entirety of the substrate 4 and extending in parallel with the plane of the sample holder 5. Diameter of the W wire forming the catalyst 8 may be, for example, in the range from 0.4 to 0.6 mm. The catalyst 8 is heated by electrically charging it directly. Original form of the catalyst 8 is not limited to linear ones.

Figure 4:
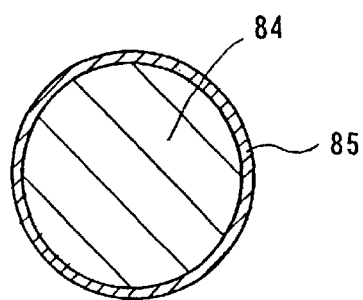
FIG. 4 is a cross-sectional view that shows a cross-sectional structure of a catalyst of a catalytic CVD apparatus used for growth of a silicon layer in some embodiments of the invention.

As shown in FIG. 4, on the surface of the W wire 84 of the catalyst 84 used here, a WN film 85 may be formed by sputtering or MOCVD when the catalyst 8 is manufactured. Alternatively, as explained later, after the catalyst 8 is mounted in the growth chamber 1, a WN film 85 may be formed by nitrifying the surface of W wire 81 in the growth chamber 1 before the growth is started.

Next explained is a growth method of a polycrystalline silicon layer by catalytic CVD according to the first embodiment. In the first embodiment, a polycrystalline silicon layer is grown after a WN film is made by nitrifying the surface of the catalyst 8 made of W wire immediately before the growth.

More specifically, in the first embodiment, nitrification of the surface of the catalyst 8 is first conducted in the following process in the growth chamber 1 of the catalytic CVD apparatus shown in FIG. 1.

The interior of the growth chamber 1 is reduced in pressure to about $(1\sim2)\times10^{-6}$ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Specifically, the susceptor temperature of the sample holder portion 5 may be adjusted to 350° C., hydrogen flow rate to 100 sccm/min, and pressure in the growth chamber 1 to 6.7 Pa (50 mTorr).

After that, the catalyst 8 is electrically charged and heated to a temperature in the range from 1800° C. to 2100° C. (for example, 2000° C.), and it is maintained at this temperature for a predetermined length of time (for example five minutes). The reason why hydrogen is kept flowing into the growth chamber 1 as mentioned above lies in preventing oxidation of the catalyst 8 during heating.

After that, ammonium is supplied in addition to hydrogen from the gas supply pipe 3 into the growth chamber 1 under controlled values of flow rate and pressure. More specifically, for example, the susceptor temperature of the sample holder portion 5 is adjusted to 350° C., flow rate of hydrogen to 100 sccm/min, flow rate of ammonium to 100 sccm/min, and pressure in the growth chamber 1 to 1.33~13.3 Pa (10~100 mTorr), and these conditions are maintained for a length of time required (for example, for 30 minutes). As a result, as shown in FIG. 4, surface of the catalyst 8 is nitrified, and the WN film 85 is formed.

Subsequently, ammonium flow amount to the growth chamber 1 is set to zero, and power supply to the catalyst 8 is interrupted for five minutes, for example, to lower its temperature.

Thereafter, hydrogen flow rate is adjusted to zero, and the pressure is reduced to about $(1\sim2)\times10^{-6}$ Pa. Particularly, ammonium introduced into the growth chamber 1 is discharged. It takes about 5 minutes for this discharge.

Through these procedures, surface nitrification of the catalyst 8 is completed.

Next started is the growth of a polycrystalline silicon layer in the following process.

Figure 5A:
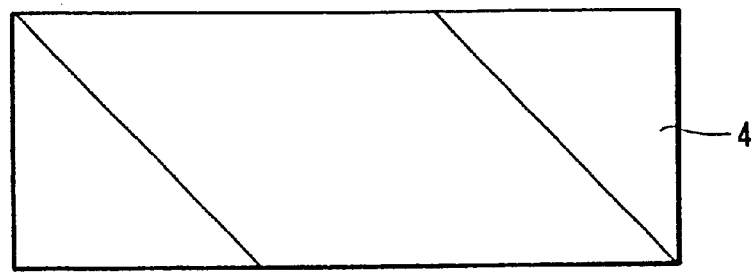
FIGS. 5A and 5B are cross-sectional views for explaining a method of growing a polycrystalline silicon layer by catalytic CVD according to the first embodiment of the invention.

That is, as shown in FIG. 5A, first prepared is a substrate 4 which is then washed and dried. Usable as the substrate 4 is a glass substrate, quartz substrate, or silicon substrate having formed a silicon oxide ($SiO_2$) film on its surface, for example.

After that, the substrate 4 is mounted to the susceptor of the sample holder portion 5 inside the growth chamber 1 of the catalytic CVD apparatus shown in FIG. 1 through a loadlock chamber, not shown. The susceptor of the sample holder portion 5 is previously adjusted to the growth temperature by the heater 6.

After that, interior pressure of the growth chamber 1 is reduced to about $(1\sim2)\times10^{-6}$ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Interior pressure of the growth chamber 1 is adjusted to a value much lower than the pressure employed by conventional catalytic CVD. More specifically, it is adjusted to a value in the range from $1.33\times10^{-3}$ Pa to 4 Pa (from 0.01 to 30 mTorr), namely for example, 0.11 Pa (0.8 mTorr). Hydrogen flow rate is adjusted to 200 sccm/min.

After that, the catalyst 8 is electrically charged and heated to 1700° C., and it is maintained at this temperature for 10 minutes, for example. The reason why hydrogen is kept flowing into the growth chamber 1 as mentioned above lies in preventing oxidation of the catalyst 8 during heating.

Figure 5B:
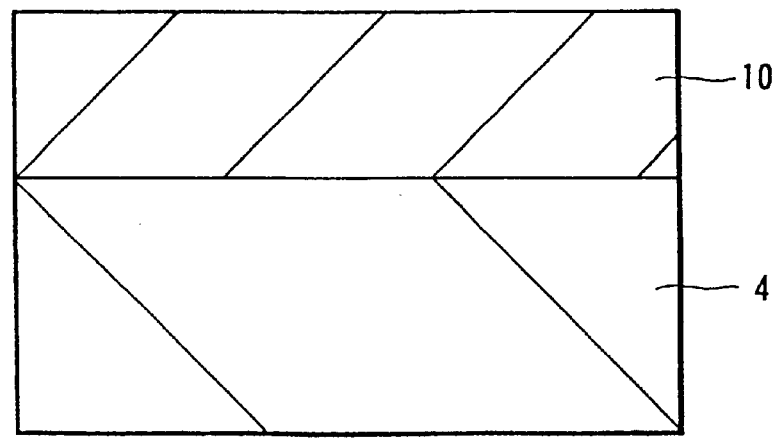

After that, silane is supplied in addition to hydrogen from the gas supply pipe 3 into the growth chamber 1 to grow a silicon layer of a predetermined thickness, namely, about 0.5 $\mu$m, for example. Flow amount of hydrogen is adjusted to 200 sccm/min, for example, and flow amount of silane is adjusted to 2.0 sccm/min (100% silane is used). Interior pressure of the growth chamber 1 is adjusted to, for example, 0.11 Pa (0.8 mTorr). In this manner, a polycrystalline silicon layer 10 is grown on the substrate 4 as shown in FIG. 5B.

After the growth, silane flow amount to the growth chamber 1 is set to zero, and about 3 to 5 minutes later, for example, the power supply to the catalyst 8 is interrupted to lower its temperature.

Thereafter, hydrogen flow amount to the growth chamber 1 is set to zero, and the pressure is reduced to about $(1\sim2)\times10^{-6}$ Pa. Particularly, silane introduced into the growth chamber 1 is discharged. It takes about 5 minutes for this discharge.

After that, the substrate 4 having the polycrystalline silicon layer 10 grown thereon is removed externally from the growth chamber 1 via a loadlock chamber, not shown.

Polycrystalline silicon layers actually grown in the above-explained process were evaluated by using secondary ion mass spectrometry (SIMS). Growth conditions of polycrystalline silicon layers as samples for SIMS measurement are shown in Table 1.

TABLE 1

| Sample No. | Substrate | SiH$_4$ flow rate (sccm) | H$_2$ flow rate (sccm) | Growth pressure (Pa) | Thickness (nm) |
|---|---|---|---|---|---|
| 1 | Si | 2 | 200 | 0.11 | 300 |
| 2 | SiO$_2$/Si | 2 | 200 | 0.11 | 300 |
| 3 | Si | 2 | 200 | 0.11 | 300 |

Figure 6:
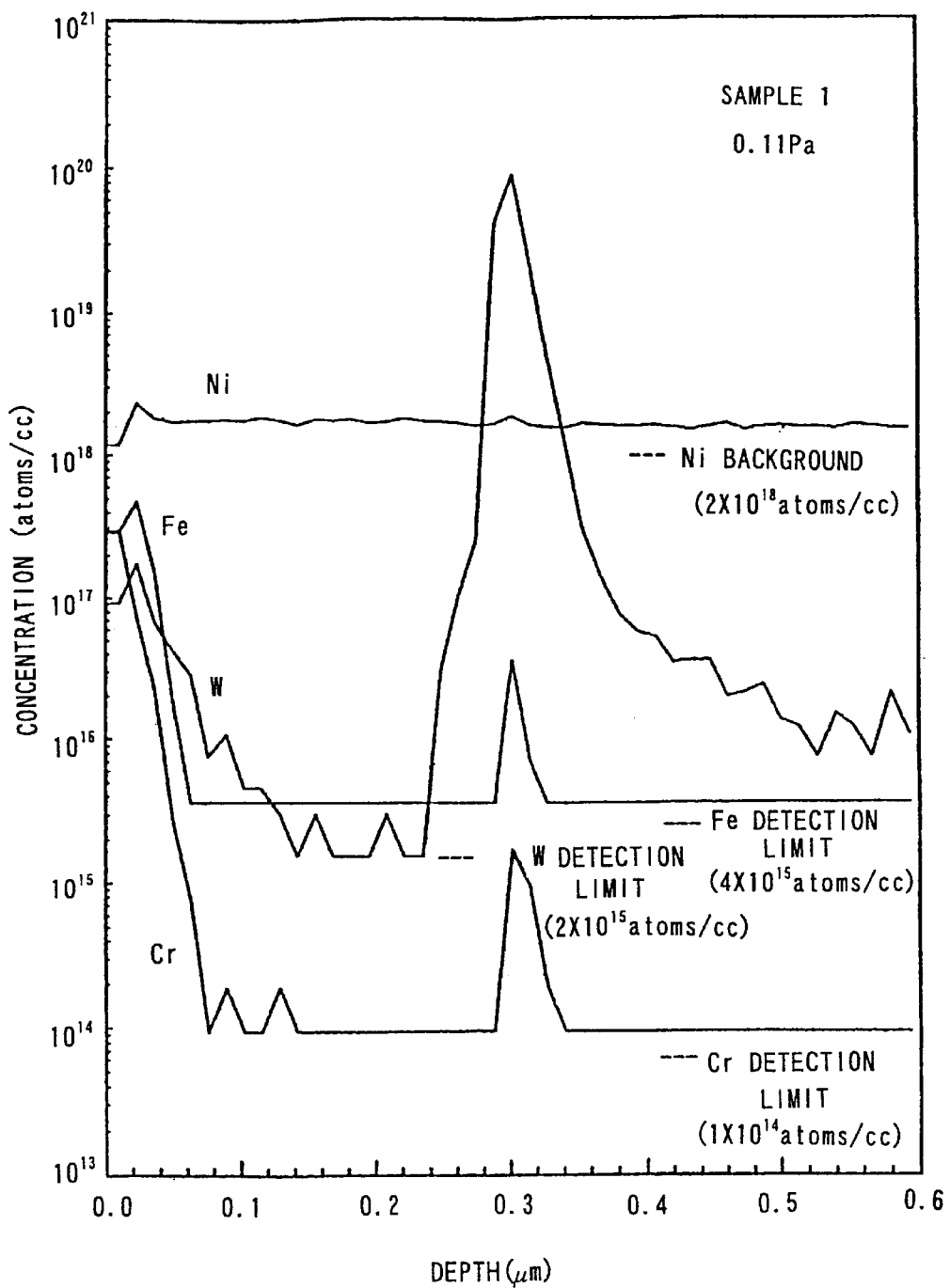
FIG. 6 is a schematic diagram that shows a result of SIMS measurement.
Figure 7:
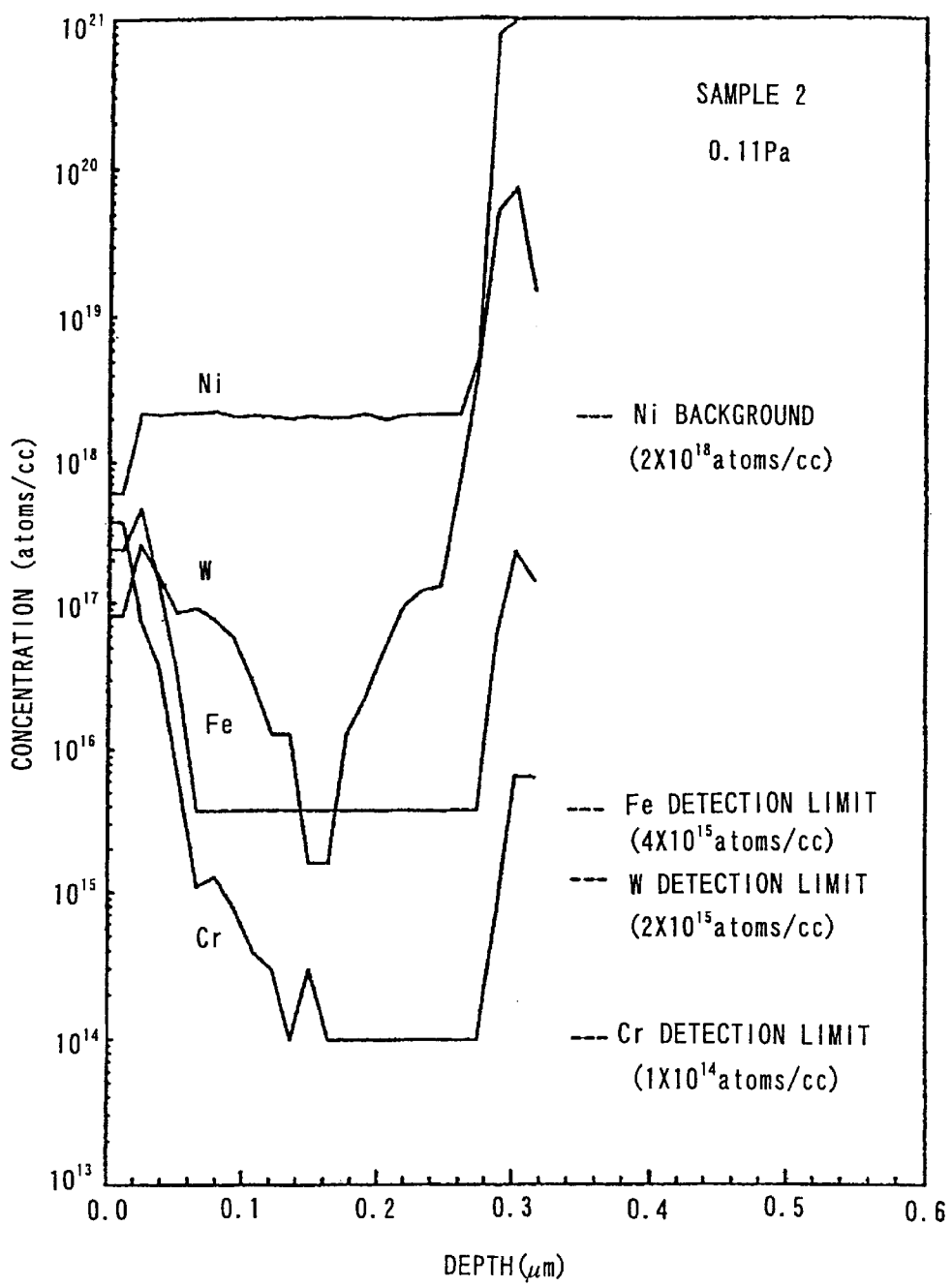
FIG. 7 is a schematic diagram that shows a result of SIMS measurement.
Figure 8:
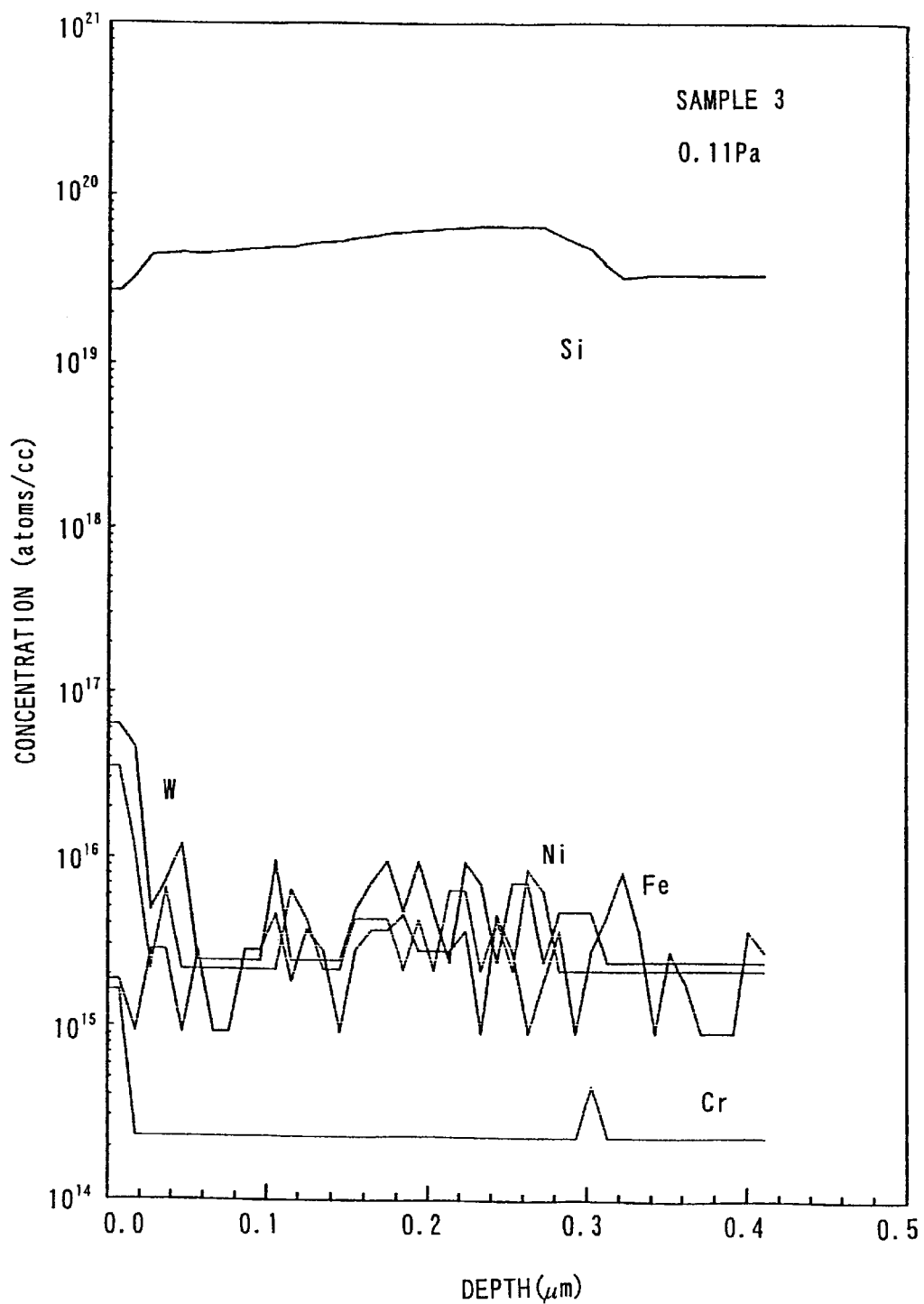
FIG. 8 is a schematic diagram that shows a result of SIMS measurement.
Figure 9:
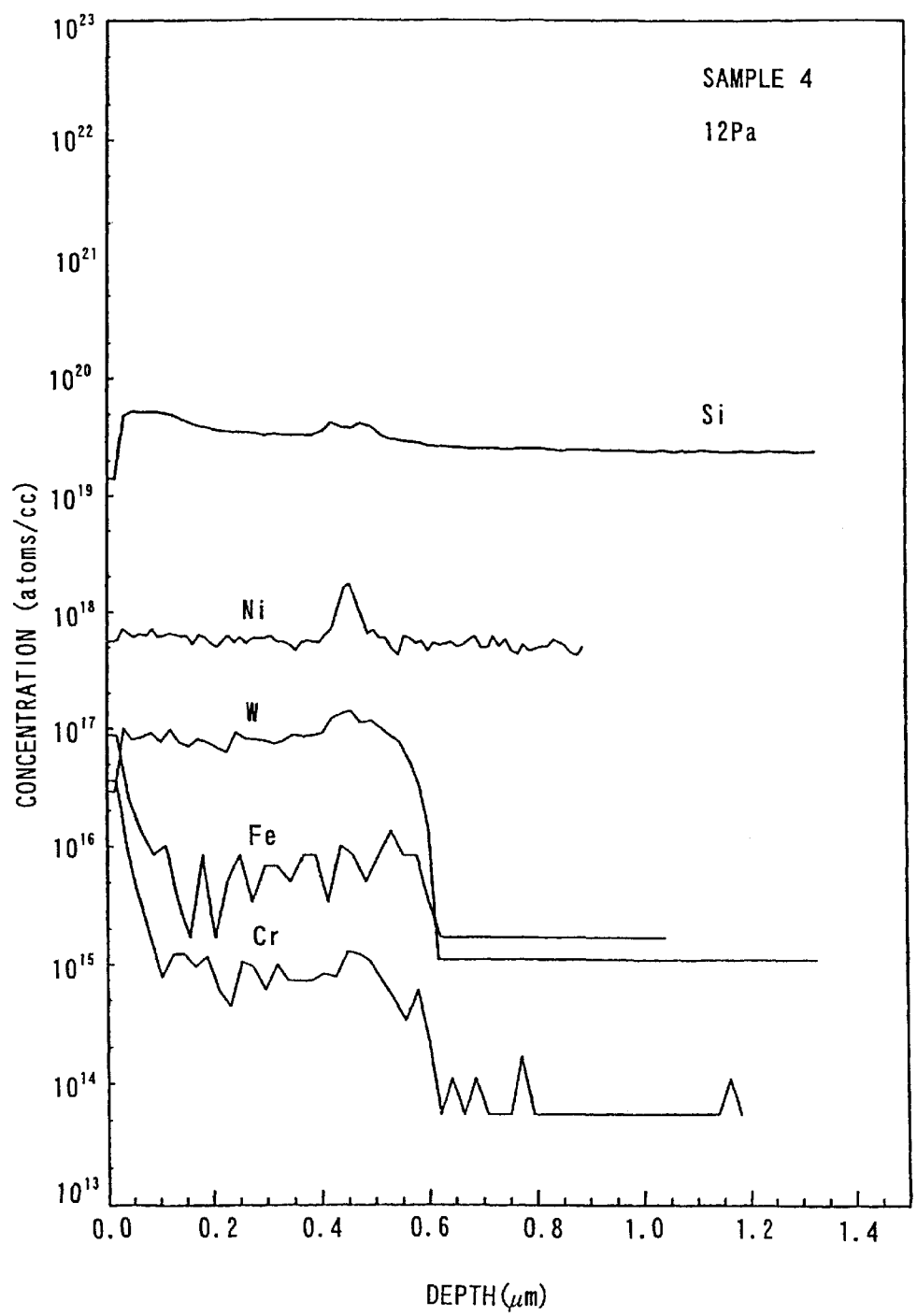
FIG. 9 is a schematic diagram that shows a result of SIMS measurement.
Figure 10:
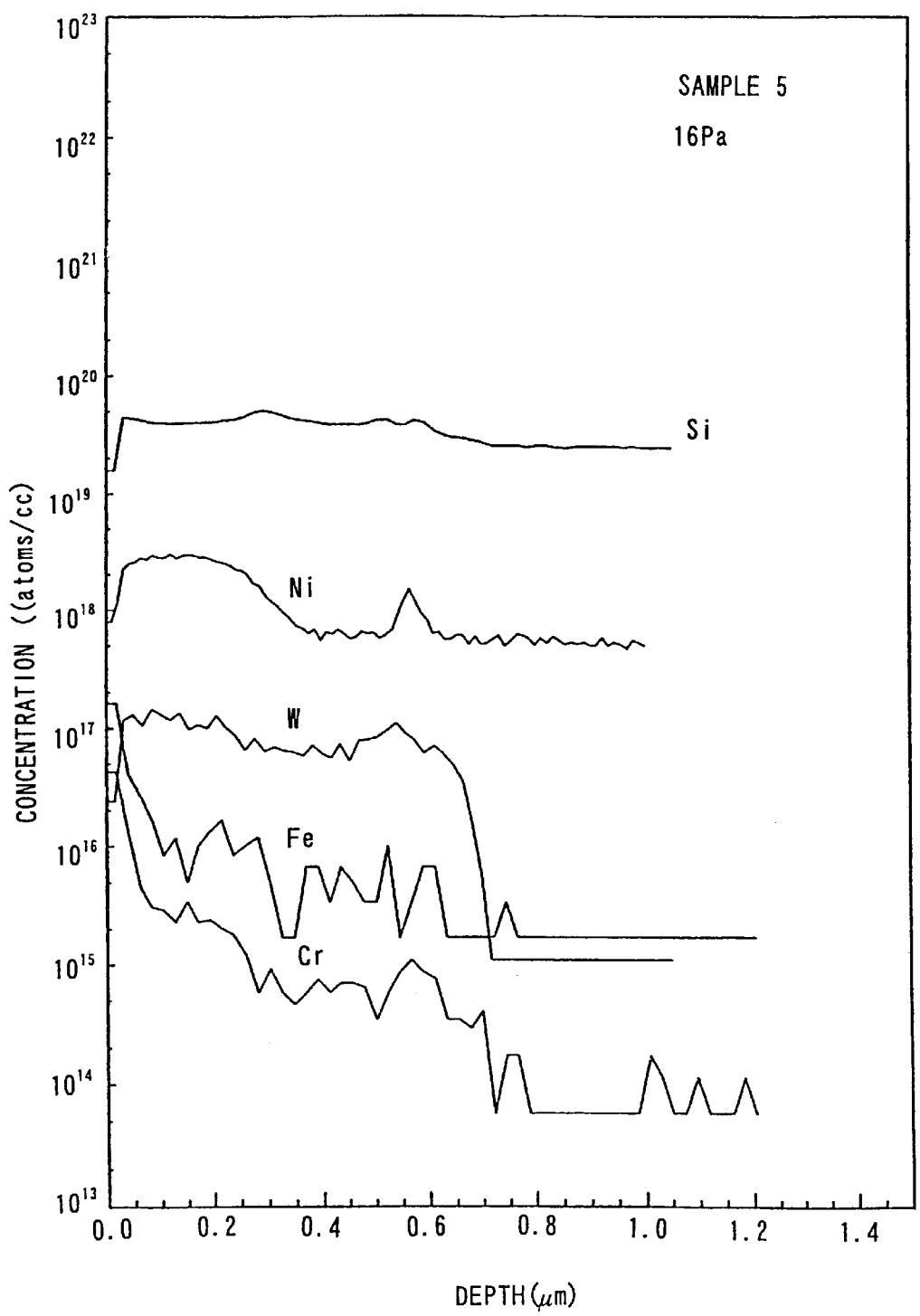
FIG. 10 is a schematic diagram that shows a result of SIMS measurement.
Figure 11:
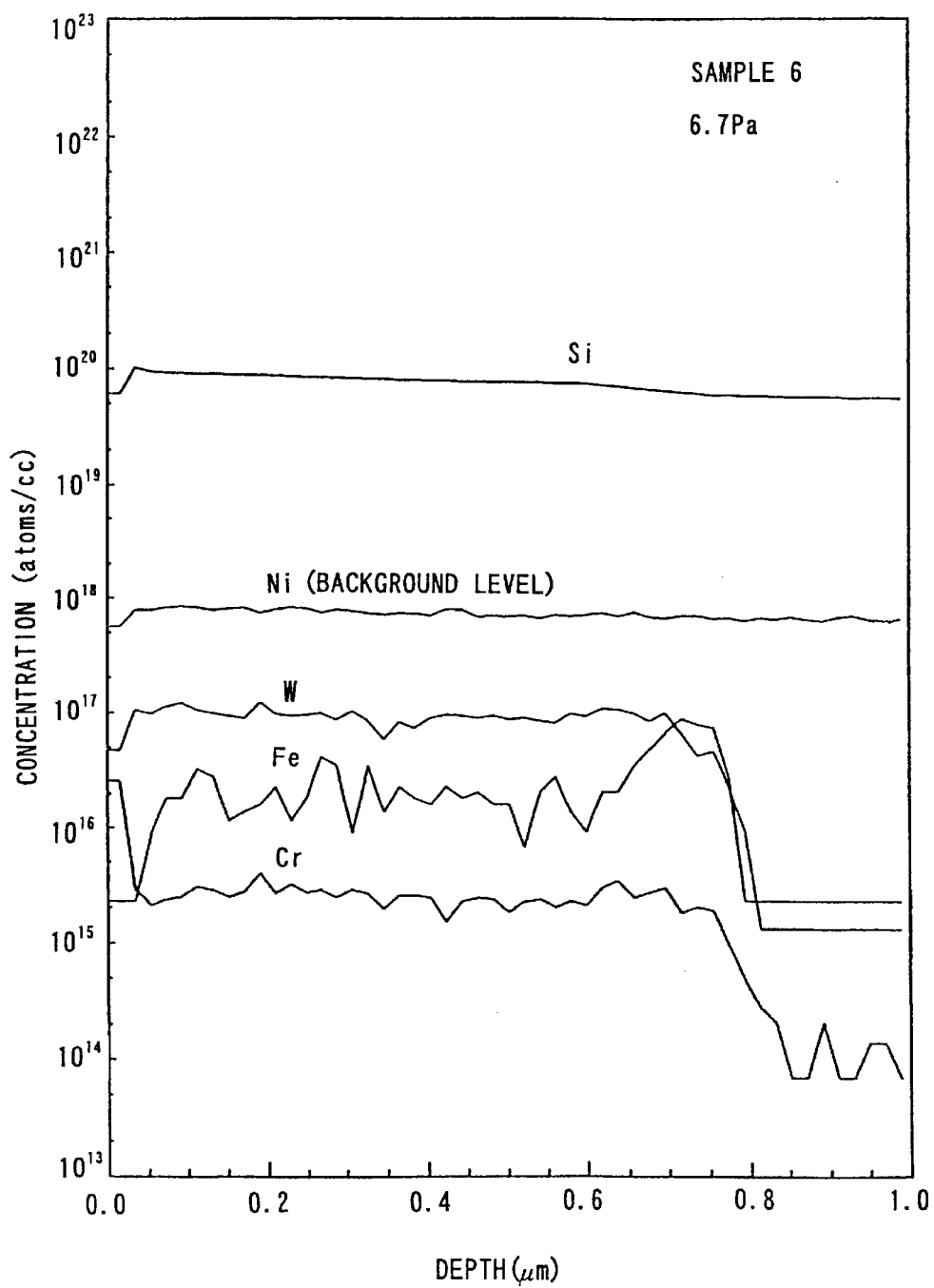
FIG. 11 is a schematic diagram that shows a result of SIMS measurement.
Figure 12:
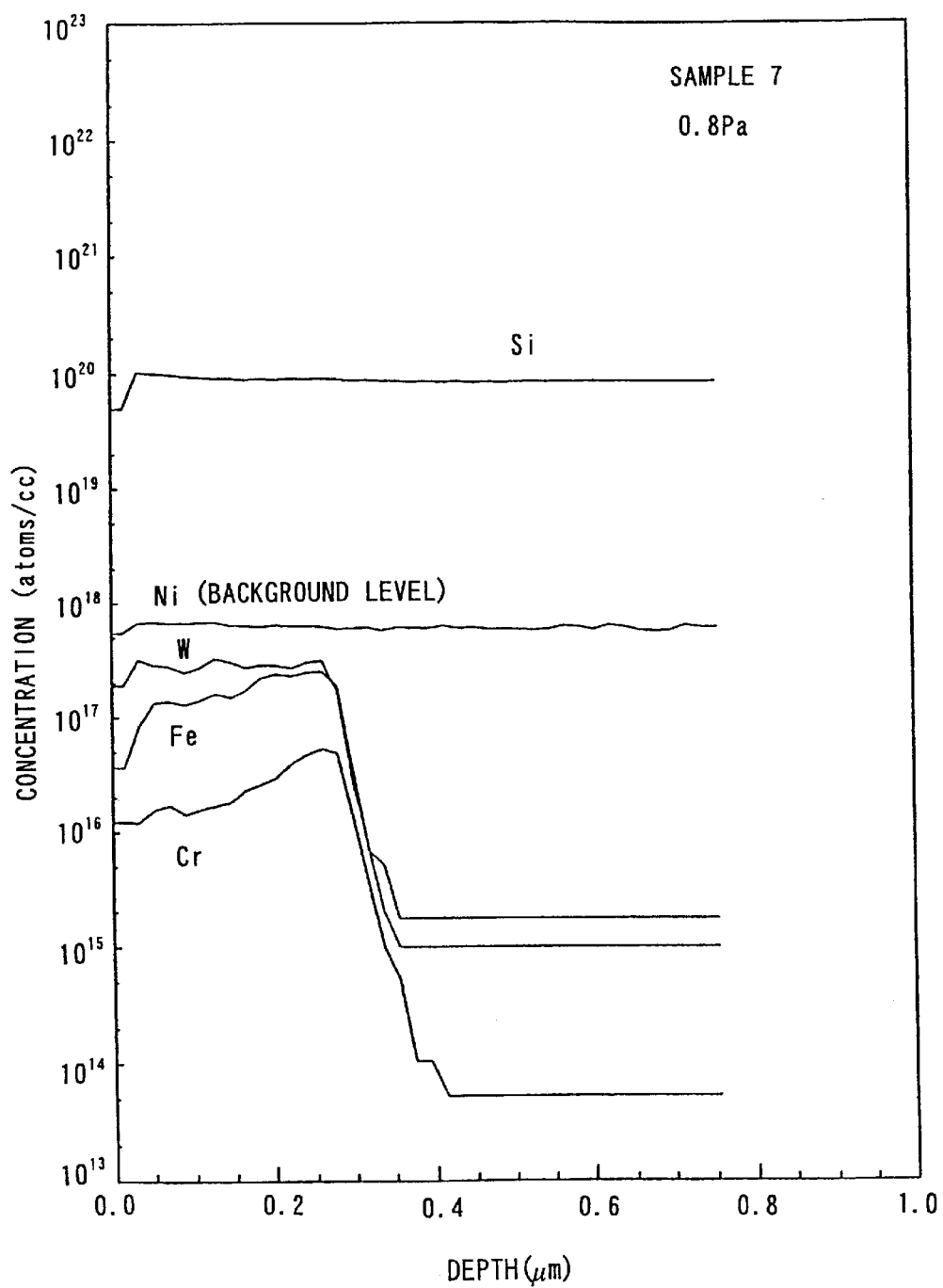
FIG. 12 is a schematic diagram that shows a result of SIMS measurement.
Figure 13:
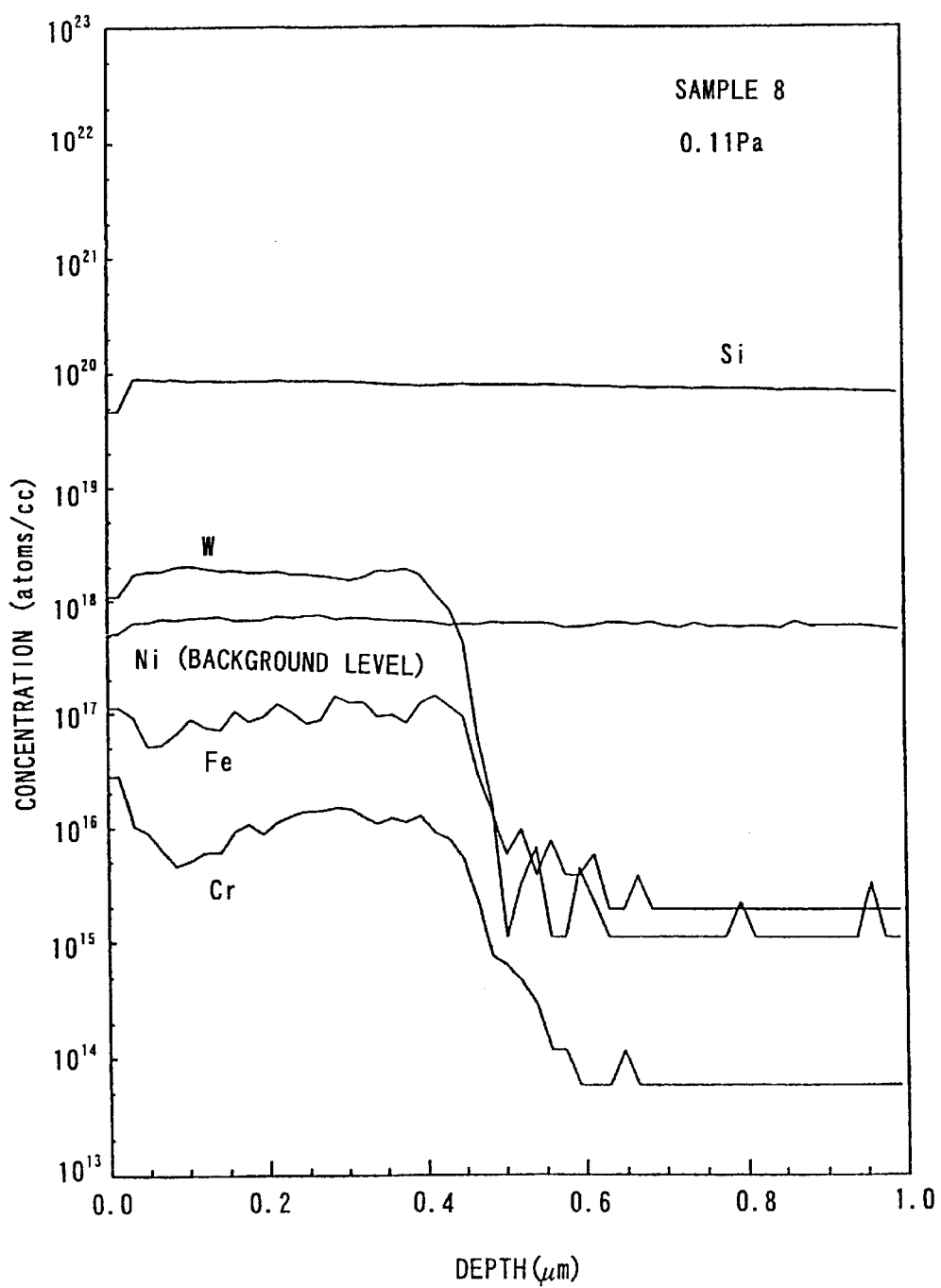
FIG. 13 is a schematic diagram that shows a result of SIMS measurement.
Figure 14:
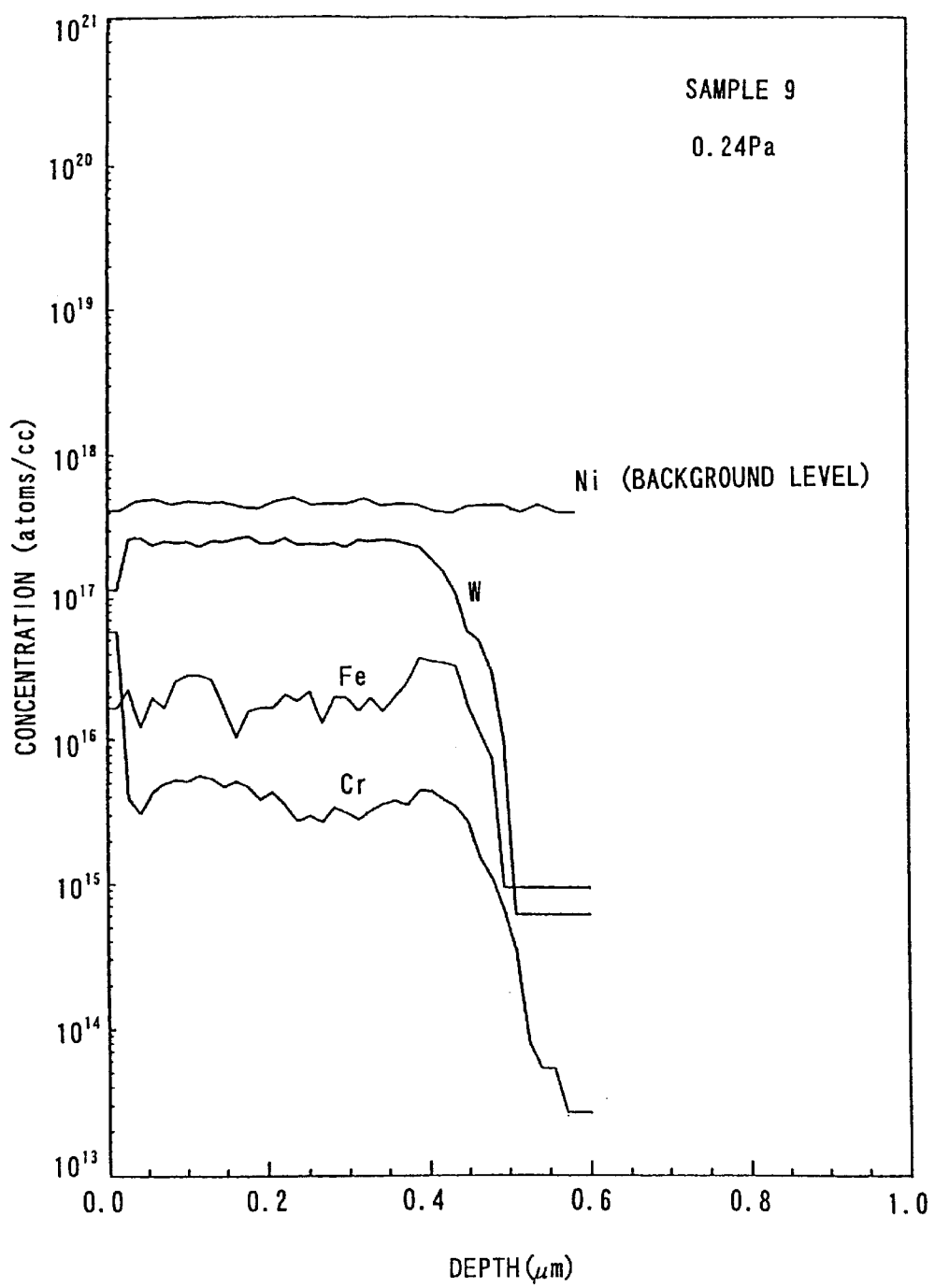
FIG. 14 is a schematic diagram that shows a result of SIMS measurement.
Figure 15:
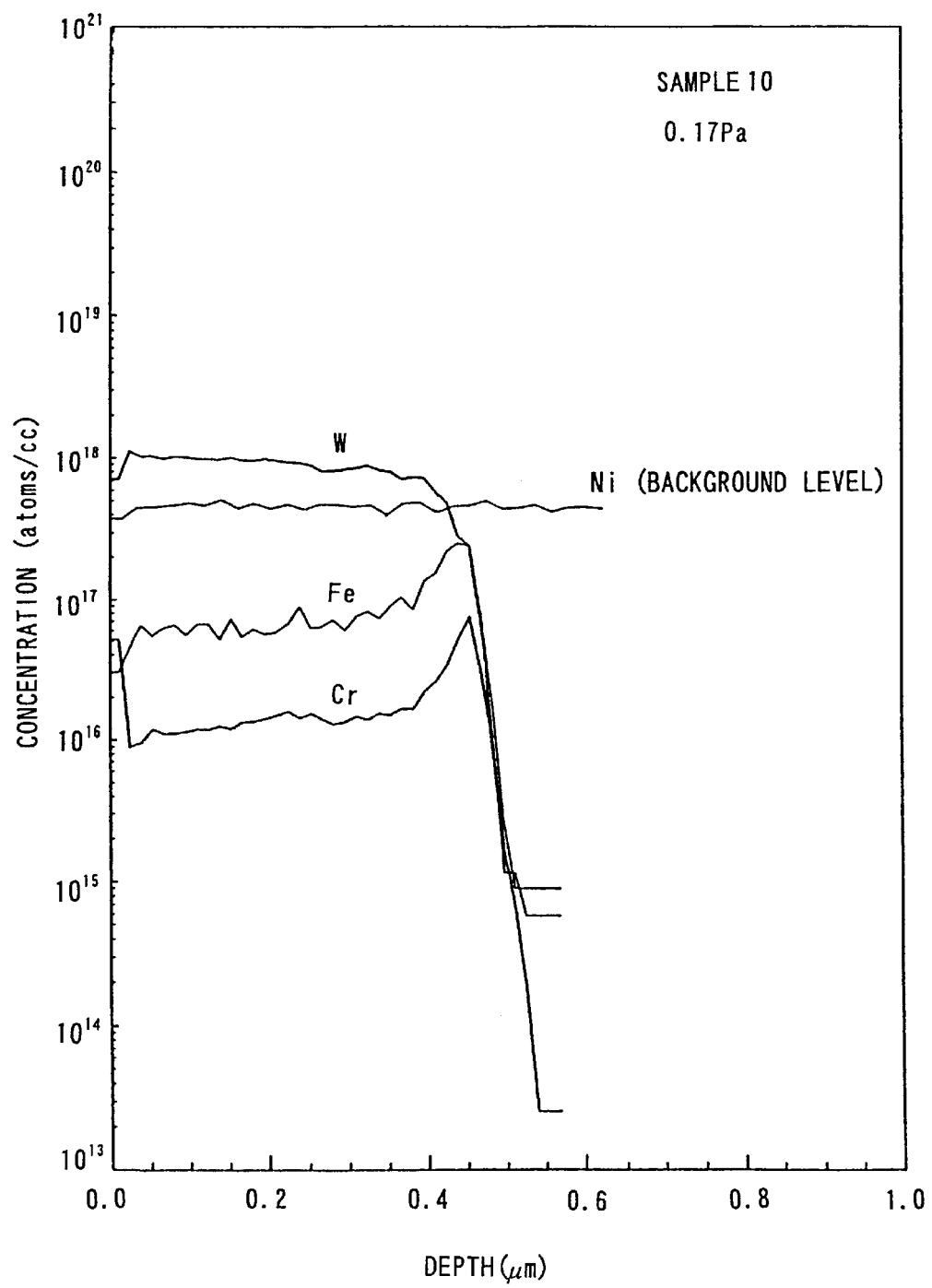
FIG. 15 is a schematic diagram that shows a result of SIMS measurement.

FIGS. 6 and 7 show results of SIMS measurement conducted with Samples 1 and 2. As apparent from FIGS. 6 and 7, metal impurity concentrations in the polycrystalline silicon layers in Samples 1 and 2 were not beyond detector limits as to any of tungsten, iron, chromium and nickel except for surface regions and boundary regions with their substrates. Here the detector limits are $2\times10^{14}$ atoms/cc for tungsten, $4\times10^{15}$ atoms/cc for iron, $1\times10^{14}$ atoms/cc for chromium, and $2\times10^{18}$ atoms/cc for nickel. Metal impurity concentrations are high in surface regions of the polycrystalline silicon layers and boundary regions with their substrates presumably because, upon heating the catalyst 8, the growth chamber 5 was evacuated to a high vacuum, by interrupting introduction of hydrogen into the growth chamber 5, and even under the high vacuum, H$_2$O and O$_2$ existed and they oxidized the catalyst 8 to produce tungsten oxide, which in turn vaporized and are ingested into the growth layers. Therefore, by introducing hydrogen into the growth chamber 5 upon heating the catalyst 8, metal impurity concentrations can be lowered to or below detector limits also in the surface regions of the polycrystalline silicon layers and boundary regions with their substrates. A result thereof is shown in FIG. 8.

For comparison purposes, explained are results of measurement of metal impurity concentrations contained in polycrystalline silicon layers grown by conventional catalytic CVD using catalysts 8 made of W wire with the surface not nitrified. For any of Samples 4 to 10 shown below, temperature of the catalyst 8 was adjusted to values in the range from 1650° C. to 1700° C., and the susceptor temperature of the holder portion was adjusted to 200° C. Growth as 30 minutes for Sample 4, 20 minutes for Sample 5, 25 minutes for Sample 6, 30 minutes for Sample 7, 180 minutes for Sample 8, 30 minutes for Sample 9 and 150 minutes for Sample 10.

TABLE 2

| Sample No. | Substrate | SiH$_4$ flow rate (sccm) | H$_2$ flow rate (sccm) | Growth pressure (Pa) | Thickness (nm) |
|---|---|---|---|---|---|
| 4 | Si | 3.0 | 90 | 12 | 500 |
| 5 | Si | 4.5 | 90 | 16 | 500 |
| 6 | Si | 1.5 | 100 | 6.7 | 300 |
| 7 | Si | 1.5 | 100 | 0.8 | 300 |
| 8 | Si | 0.25 | 30 | 0.11 | 300 |
| 9 | Si | 2 | | 0.24 | 400 |
| 10 | Si | 0.3 | | 0.17 | 400 |

Results of SIMS measurement regarding metal impurities in Samples 4 through 10 are shown in FIGS. 9 through 15. Metal impurity concentrations in polycrystalline silicon layers are shown in Table 3.

TABLE 3

| Sample No. | W concentration (atoms/cc) | Fe concentration (atoms/cc) | Cr concentration (atoms/cc) | Ni concentration (atoms/cc) |
|---|---|---|---|---|
| 4 | $9 \times 10^{16}$ | $7 \times 10^{15}$ | $9 \times 10^{14}$ | within detector limit |
| 5 | $9 \times 10^{16}$ | $7 \times 10^{15}$ | $1 \times 10^{15}$ | $3 \times 10^{18}$ ~within detector limit |
| 6 | $1 \times 10^{17}$ | $2 \times 10^{16}$ | $3 \times 10^{15}$ | within detector limit |
| 7 | $3 \times 10^{17}$ | $2 \times 10^{17}$ | $3 \times 10^{16}$ | within detector limit |
| 8 | $2 \times 10^{18}$ | $9 \times 10^{16}$ | $1 \times 10^{16}$ | within detector limit |
| 9 | $3 \times 10^{17}$ | $2 \times 10^{16}$ | $4 \times 10^{15}$ | within detector limit |
| 10 | $1 \times 10^{18}$ | $8 \times 10^{16}$ | $1.5 \times 10^{16}$ | within detector limit |

It is known from FIGS. 9 through 15 and Table 3 that, in any of Samples 4 to 10, W, Fe and Cr concentrations contained in polycrystalline silicon layers are very high. Comparing Samples 4 and 5, they are approximately equal in W, Fe and Cr concentrations, but a difference is observed regarding Ni concentration depending on the growth pressure, and Ni is found only in Sample 5 made under the higher growth temperature. Comparing Samples 6 through 8, W, Fe and Cr were found in all samples, but Ni was below the detector limit. Regarding W concentration, it becomes higher as the growth pressure decreases presumably because the lower the growth pressure, the longer the growth time of the samples.

Figure 16:
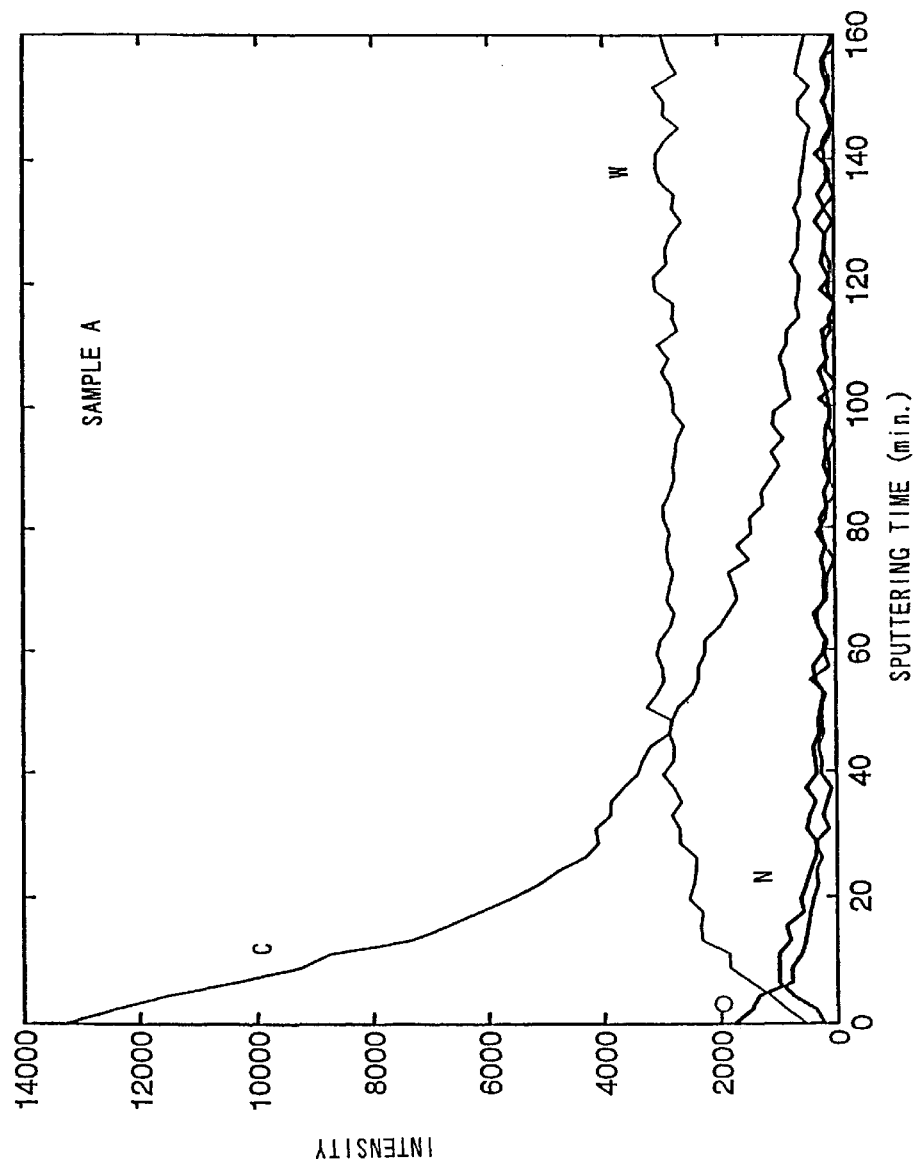
FIG. 16 is a schematic diagram that shows a result of Augier electron spectroscopy of a catalyst after surface nitrification.
Figure 17:
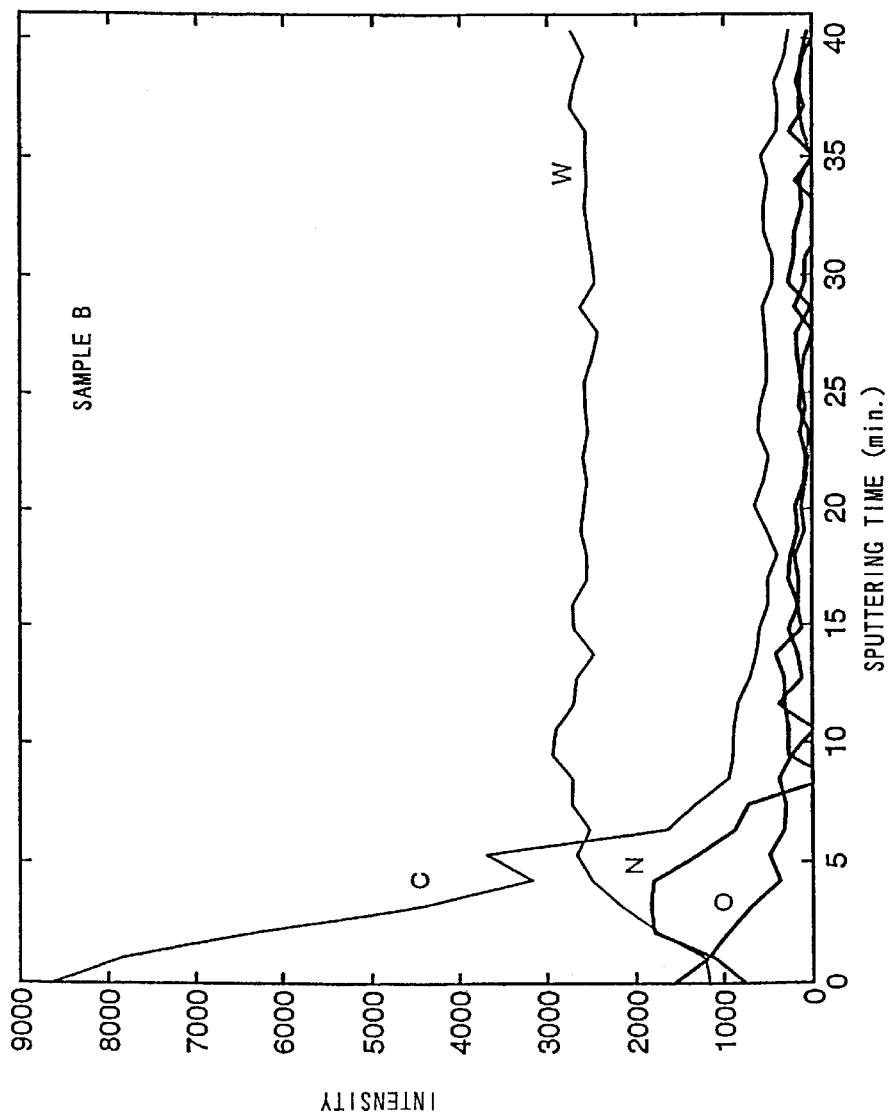
FIG. 17 is a schematic diagram that shows a result of Augier electron spectroscopy of a catalyst after surface nitrification.
Figure 18:
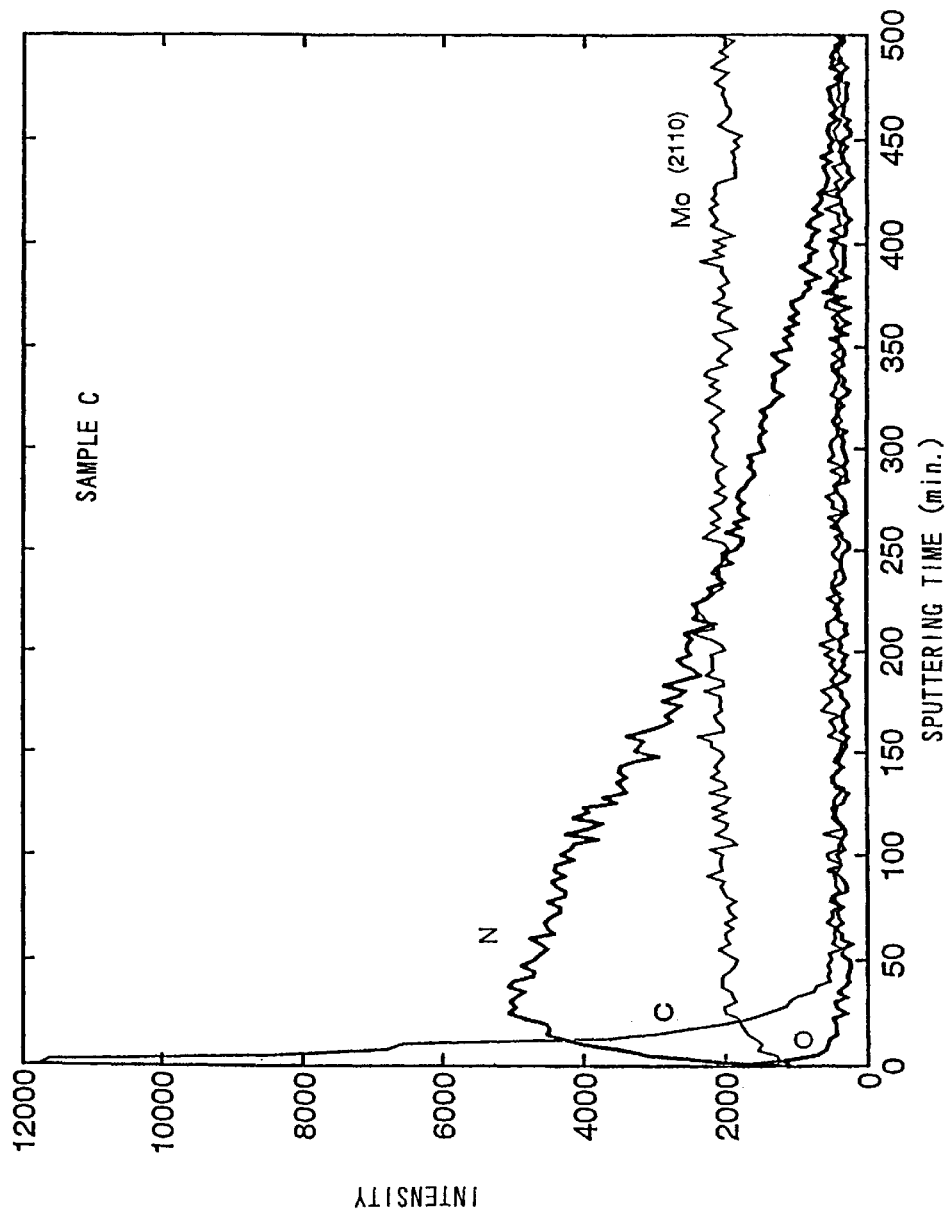
FIG. 18 is a schematic diagram that shows a result of Augier electron spectroscopy of a catalyst after surface nitrification.

Here is explained a result of evaluation by Augier electron spectrometry of nitride films made by nitrifying surfaces of catalysts 8. Among catalyst samples used for evaluation, Sample A was prepared by supplying ammonium by the flow rate of 300 sccm under the pressure of 670 Pa (5 Torr) at 1800° C. and nitrifying the surface of the catalyst made of W wire by interaction with ammonium for 120 minutes. Sample B was prepared by supplying ammonium by the flow rate of 300 sccm under the pressure of 670 Pa (5 Torr) at 1900° C. and nitrifying the surface of the catalyst made of W wire by interaction with ammonium for 120 minutes. Results of measurement of Samples A and B are shown in FIGS. 16 and 17, respectively. For comparison purposes, FIG. 18 shows results of measurement of Sample C prepared by supplying NH$_3$ by the flow rate of 300 sccm under the pressure of 670 Pa (5 Torr) at 1900° C. and nitrifying the surface of the catalyst made of molybdenum wire by interaction with NH$_3$ for 120 minutes. It is known from FIGS. 16, 17 and 18 that, in any of Samples A, B and C, a nitride film has been formed on the surface (WN films in Samples A and B and MoN film in the sample C). In qualitative comparison of Samples A and B, the latter has a higher content of N. It is highly likely that a thicker nitride film was formed on Sample C than on Samples A and B.

As explained above, according to the first embodiment, since the polycrystalline silicon layer is grown by catalytic CVD using the catalyst 8 having formed the WN film by nitrifying the surface of W wire, concentration of metal impurities contained in the polycrystalline silicon layer can be reduced significantly to a value smaller than conventional values by several digits. Therefore, it is possible to obtain a polycrystalline silicon layer having a higher electrical property, especially in electron mobility, as compared with polycrystalline silicon layers grown by conventional catalytic CVD.

In addition, since the growth pressure for growing the polycrystalline silicon layer by catalytic CVD is adjusted to 0.1 Pa (0.8 mTorr), it is possible to grow a polycrystalline silicon layer of a low oxygen concentration in which the maximum oxygen concentration is not higher than $5 \times 10^{18}$ atoms/cc at least in its region 10 nm deep, or 50 nm deep, depending on the case, or even 100 nm deep from the boundary with the substrate 4. This polycrystalline silicon layer is a high-quality polycrystalline silicon layer excellent in surface morphology, crystal grain size, oxygen concentration, exfoliation property and crystallization ratio that are requirements for use in TFT. More specifically, it is possible to grow a polycrystalline silicon layer, for example, which has a smooth surface, crystal grain size not smaller than 5 nm, oxygen concentration not higher than 0.001 atomic %, unlikeliness to exfoliate from the base and crystallization ratio not lower than 85%.

Furthermore, since catalytic CVD is used for growth of the polycrystalline silicon layer, reaction efficiency of reaction gas, such as silane, is as high as tens %. Therefore, it contributes to saving resources, decreases the load to the environment, and can reduce the growth cost.

IN addition to those, according to the first embodiment, any polycrystalline silicon thin film element, such as hall element having a high mobility (for example, 30~50 cm$^2$/V·sec), can be formed on an alumino-silicate glass substrate, for example, without using the step of excimer laser annealing (ELA).

Figure 19:
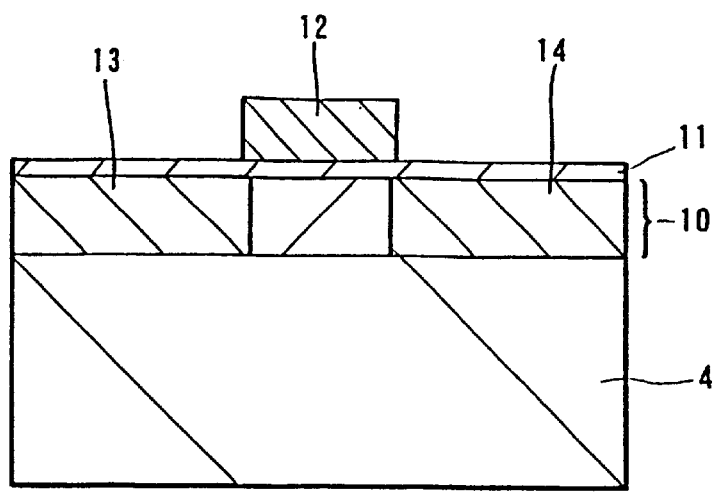
FIG. 19 is a cross-sectional view that shows TFT using a polycrystalline silicon layer grown by catalytic CVD according to the first embodiment of the invention.

FIG. 19 shows an example of TFT using a polycrystalline silicon layer grown by the method according to the first embodiment explained above. That is, as shown in FIG. 19, this TFT includes a polycrystalline silicon layer 10 grown by catalytic CVD according to the first embodiment on a substrate 4 such as glass substrate or quartz substrate. Thickness of the polycrystalline silicon layer 10 is around 10 through 100 nm, its metal impurity concentration is not higher than the detector limit, and its maximum oxygen concentration is not higher than $5 \times 10^{18}$ atoms/cc. Grown on the polycrystalline silicon layer 10 is a gate insulating film 11 such as SiO$_2$ film by plasma CVD, for example. Formed on the gate insulating film 11 is a gate electrode 12 made of a polycrystalline silicon layer doped with an impurity, for example. In the polycrystalline silicon layer 10, a source region 13 and a drain region 14 are formed in self alignment with the gate electrode 12. The polycrystalline silicon layer 10 in the region between these source region 13 and drain region 14 form a carrier channel.

Since the polycrystalline silicon layer 10 forming the carrier channel has a high quality excellent in surface morphology, crystal grain size, oxygen concentration, exfoliation property, and crystallization ratio, a high-performance TFT having a high carrier mobility and a high reliability can be obtained.

Next explained is a method of growing a polycrystalline silicon layer by catalytic CVD according to the second embodiment of the invention. In the second embodiment, a polycrystalline silicon layer is grown after a WN film is made by nitrifying the surface of the catalyst 8 made of W wire immediately before the growth.

That is, in the second embodiment, as shown in FIG. 5A, first prepared is a substrate 4 which is then washed and dried. Usable as the substrate 4 is a glass substrate, quartz substrate, or silicon substrate having formed a silicon oxide (SiO$_2$) film on its surface, for example.

After that, the substrate 4 is mounted to the susceptor of the sample holder portion 5 inside the growth chamber 1 of the catalytic CVD apparatus shown in FIG. 1 through a loadlock chamber, not shown. The susceptor of the sample holder portion 5 is previously adjusted to the growth temperature, for example 350° C., by the heater 6.

After that, interior pressure of the growth chamber 1 is reduced to about $(1\sim2) \times 10^{-6}$ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Interior pressure of the growth chamber 1 is adjusted to a value much lower than the pressure employed by conventional catalytic CVD. More specifically, it is adjusted to a value in the range from $1.33 \times 10^{-3}$ Pa to 4 Pa (from 0.01 to 30 mTorr), namely for example, 0.11 Pa (0.8 mTorr). Hydrogen flow rate is adjusted to 200 sccm/min.

Subsequently, in this hydrogen atmosphere, the catalyst 8 made of W is electrically charged and heated. When the temperature exceeds 1000° C., ammonium is supplied in addition to hydrogen by the flow rate of, for example, 200 sccm/min from the gas supply pipe 3 into the growth chamber 1 while continuously electrically charging the catalyst 8 to heat it to 1700° C. Interior pressure of the growth chamber 1 is adjusted to 1.33 Pa (10 mTorr), for example. The catalyst 8 is maintained in these conditions for 10 minutes, for example. As a result, as shown in FIG. 4, the surface of the catalyst 8 is nitrified, and the WN film 85 is formed.

After that, ammonium flow amount to the growth chamber 1 is set to zero, and about 3 to 5 minutes later, for example, the power supply to the catalyst 8 is interrupted to lower its temperature. Interior pressure of the growth chamber 1 is adjusted to a value much lower than that for conventional catalytic CVD, more specifically to a value in the range from $1.33 \times 10^{-3}$ Pa to 4 Pa (0.01 to 30 mTorr), i.e., for example, 0.11 Pa (0.8 mTorr). Hydrogen flow rate is adjusted to 200 sccm/min.

Thereafter, the catalyst 8 whose surface has been nitrified by the foregoing nitrification is electrically charged and heated to 1700° C., and maintained at this temperature for 10 minutes, for example. The reason why hydrogen is supplied to the growth chamber as explained above lies in preventing oxidation of the catalyst 8 when heated.

Subsequently, silane is supplied in addition to hydrogen from the gas supply pipe 3 into the growth chamber 1 to grow a silicon layer of a predetermined thickness, namely, about 0.5 μm, for example. Flow amount of hydrogen is adjusted to 200 sccm/min, for example, and flow amount of silane is adjusted to 2.0 sccm/min (100% silane is used). Interior pressure of the growth chamber 1 is adjusted to, for example, 0.11 Pa (0.8 mTorr). In this manner, the polycrystalline silicon layer 10 grows on the substrate 4 as shown in FIG. 5B.

After the growth, silane flow amount to the growth chamber 1 is set to zero, and about 3 to 5 minutes later, for example, the power supply to the catalyst 8 is interrupted to lower its temperature.

Thereafter, hydrogen flow amount to the growth chamber 1 is set to zero, and the pressure is reduced to about (1~2)×10⁻⁶ Pa. Particularly, silane introduced into the growth chamber 1 is discharged. It takes about 5 minutes for this discharge.

After that, the substrate 4 having the polycrystalline silicon layer 10 grown thereon is removed externally from the growth chamber 1 via a loadlock chamber, not shown.

The second embodiment also ensures the same advantages as those of the first embodiment.

Next explained is a method of growing a polycrystalline silicon layer by catalytic CVD according to the third embodiment of the invention. In the third embodiment, a polycrystalline silicon layer is grown by using a catalyst 8 made of tungsten, which is prepared beforehand by forming a WN film on the surface of the catalyst by nitirification or deposition.

That is, as shown in FIG. 5A, first prepared is a substrate 4 which is then washed and dried. Usable as the substrate 4 is a glass substrate, quartz substrate, or silicon substrate having formed a silicon oxide (SiO₂) film on its surface, for example.

After that, the substrate 4 is mounted to the susceptor of the sample holder portion 5 inside the growth chamber 1 of the catalytic CVD apparatus shown in FIG. 1 through a loadlock chamber, not shown. The susceptor of the sample holder portion 5 is previously adjusted to the growth temperature, for example 350° C., by the heater 6.

After that, interior pressure of the growth chamber 1 is reduced to about (1~2)×10⁻⁶ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Interior pressure of the growth chamber 1 is adjusted to a value much lower than the pressure employed by conventional catalytic CVD. More specifically, it is adjusted to a value in the range from 1.33×10⁻³ Pa to 4 Pa (from 0.01 to 30 mTorr), namely for example, 0.11 Pa (0.8 mTorr). Hydrogen flow rate is adjusted to 200 sccm/min.

Subsequently, in this hydrogen atmosphere, the catalyst 8 whose surface has been nitrified beforehand is electrically charged and heated to 1700° C., and maintained at the temperature for 10 minutes, for example. The reason why hydrogen is supplied to the growth chamber 1 before hand as explained above lies in preventing oxidation of the catalyst 8 when heated.

Subsequently, silane is supplied in addition to hydrogen from the gas supply pipe 3 into the growth chamber 1 to grow a silicon layer of a predetermined thickness, namely, about 0.5 μm, for example. Flow amount of hydrogen is adjusted to 200 sccm/min, for example, and flow amount of silane is adjusted to 2.0 sccm/min (100% silane is used). Interior pressure of the growth chamber 1 is adjusted to, for example, 0.11 Pa (0.8 mTorr). In this manner, the polycrystalline silicon layer 10 grows on the substrate 4 as shown in FIG. 5B.

After the growth, silane flow amount to the growth chamber 1 is set to zero, and about 3 to 5 minutes later, for example, the power supply to the catalyst 8 is interrupted to lower its temperature.

Thereafter, hydrogen flow amount to the growth chamber 1 is set to zero, and the pressure is reduced to about (1~2)×10⁻⁶ Pa. Particularly, silane introduced into the growth chamber 1 is discharged. It takes about 5 minutes for this discharge.

After that, the substrate 4 having the polycrystalline silicon layer 10 grown thereon is removed externally from the growth chamber 1 via a loadlock chamber, not shown.

The third embodiment also ensures the same advantages as those of the first embodiment.

Next explained is a method of growing a polycrystalline silicon layer by catalytic CVD according to the fourth embodiment of the invention. The fourth embodiment is the same as the first embodiment excepting that the growth pressure is adjusted to a slightly higher value, i.e. 1.33 Pa (10 mTorr), similarly to conventional catalytic CVD.

That is, in the fourth embodiment, surface nitrification of the catalyst 8 is first conducted in the following process in the growth chamber 1 of the catalytic CVD apparatus shown in FIG. 1.

The interior of the growth chamber 1 is reduced in pressure to about (1~2)×10⁻⁶ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Specifically, the susceptor temperature of the sample holder portion 5 may be adjusted to 350° C., hydrogen flow rate to 100 sccm/min, and pressure in the growth chamber 1 to 6.7 Pa (50 mTorr).

After that, the catalyst 8 is electrically charged and heated to a temperature in the range from 1800° C. to 2100° C. (for example, 2000° C.), and it is maintained at this temperature for a predetermined length of time (for example five minutes).

After that, ammonium is supplied in addition to hydrogen from the gas supply pipe 3 into the growth chamber 1 under controlled values of flow rate and pressure. More specifically, for example, the susceptor temperature of the sample holder portion 5 is adjusted to 350° C., flow rate of hydrogen to 100 sccm/min, flow rate of ammonium to 100 sccm/min, and pressure in the growth chamber 1 to 1.33~13.3 Pa (10~100 mTorr), and these conditions are maintained for a length of time required (for example, for 30 minutes). As a result, as shown in FIG. 4, surface of the catalyst 8 is nitrified, and the WN film 85 is formed.

Subsequently, ammonium flow amount to the growth chamber 1 is set to zero, and power supply to the catalyst 8 is interrupted for five minutes, for example, to lower its temperature.

Thereafter, hydrogen flow rate is adjusted to zero, and the pressure is reduced to about (1~2)×10⁻⁶ Pa. Particularly, ammonium introduced into the growth chamber 1 is discharged. It takes about 5 minutes for this discharge.

Through these procedures, surface nitrification of the catalyst 8 is completed.

Next started is the growth of a polycrystalline silicon layer in the following process.

That is, as shown in FIG. 5A, first prepared is a substrate 4 which is then washed and dried. Usable as the substrate 4 is a glass substrate, quartz substrate, or silicon substrate having formed a silicon oxide (SiO₂) film on its surface, for example.

After that, the substrate 4 is mounted to the susceptor of the sample holder portion 5 inside the growth chamber 1 of the catalytic CVD apparatus shown in FIG. 1 through a loadlock-chamber, not shown. The susceptor of the sample holder portion 5 is previously adjusted to the growth temperature by the heater 6.

After that, interior pressure of the growth chamber 1 is reduced to about (1~2)×10⁻⁶ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Interior pressure of the growth chamber 1 is adjusted to, for example, 13.3 Pa (100 mTorr). Hydrogen flow rate is adjusted to 200 sccm/min.

After that, the catalyst 8 whose surface has been nitrified by the above-explained nitrification is electrically charged and heated to 1700° C., and it is maintained at this temperature for 10 minutes, for example.

After that, silane is supplied in addition to hydrogen from the gas supply pipe 3 into the growth chamber 1 to grow a silicon layer of a predetermined thickness, namely, about 0.5 μm, for example. Flow amount of hydrogen is adjusted to 200 sccm/min, for example, and flow amount of silane is adjusted to 2.0 sccm/min (100% silane is used). Interior pressure of the growth chamber 1 is adjusted to, for example, 1.33 Pa (10 mTorr). In this manner, a polycrystalline silicon layer 10 is grown on the substrate 4 as shown in FIG. 5B.

After the growth, silane flow amount to the growth chamber 1 is set to zero, and about 3 to 5 minutes later, for example, the power supply to the catalyst 8 is interrupted to lower its temperature.

Thereafter, hydrogen flow amount to the growth chamber 1 is set to zero, and the pressure is reduced to about (1~2)×10⁶ Pa. Particularly, silane introduced into the growth chamber 1 is discharged. It takes about 5 minutes for this discharge.

After that, the substrate 4 having the polycrystalline silicon layer 10 grown thereon is removed externally from the growth chamber 1 via a loadlock chamber, not shown.

Also according to the fourth embodiment, similarly to the first embodiment, since the polycrystalline silicon layer is grown by catalytic CVD using the catalyst 8 having formed the WN film by nitrifying the surface of W wire, concentration of metal impurities contained in the polycrystalline silicon layer can be reduced significantly to a value smaller than conventional values by several digits. Therefore, it is possible to obtain a polycrystalline silicon layer having a higher electrical property, especially in electron mobility, as compared with polycrystalline silicon layers grown by conventional catalytic CVD.

Next explained is a method of growing a polycrystalline silicon layer by catalytic CVD according to the fifth embodiment of the invention. In the fifth embodiment, a silicon nitride layer and a polycrystalline silicon layer are sequentially grown on a substrate by catalytic CVD, and nitrification of the catalyst is conducted while the silicon nitride layer is grown.

Figure 20A:
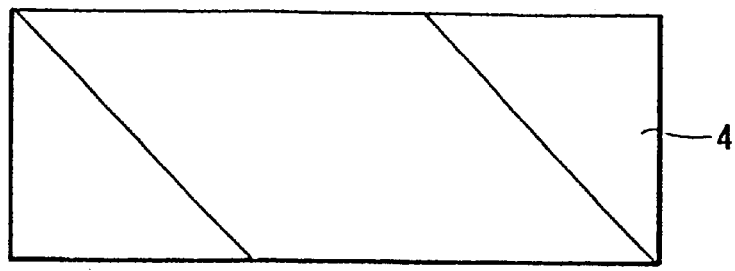
FIGS. 20A and 20B are cross-sectional views for explaining a method of growing a polycrystalline silicon layer by catalytic CVD according to the third embodiment of the invention.

That is, in the fifth embodiment, as shown in FIG. 20A, first prepared is a single crystal silicon substrate as the substrate 4. The single crystal silicon substrate next undergoes washing, removal of a thin oxide film from the surface with diluted hydrofluoric acid (1~5% water solution), washing with pure water, and subsequent drying.

After that, the single crystal silicon substrate is mounted to the susceptor of the sample holder portion 5 inside the growth chamber 1 of the catalytic CVD apparatus shown in FIG. 1 through a loadlock chamber, not shown. The susceptor of the sample holder portion 5 is previously adjusted to the growth temperature by the heater 6.

After that, interior pressure of the growth chamber 1 is reduced to about (1~2)×10⁻⁶ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Interior pressure of the growth chamber 1 is adjusted to, for example, 13.3 Pa (100 mTorr). Hydrogen flow rate is adjusted to 200 sccm/min. Subsequently, the catalyst 8 is electrically charged and heated to 1800° C.

Figure 20B:
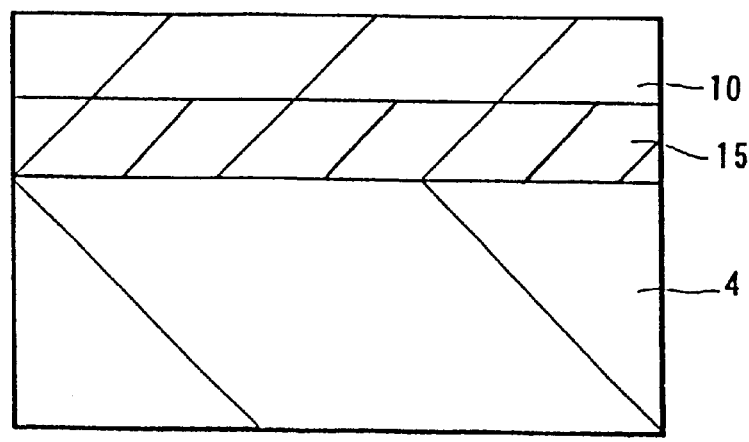

Subsequently, silane and ammonium are supplied in addition to hydrogen from the gas supply pipe 3 into the growth chamber 1 to grow a silicon nitride layer of a predetermined thickness, namely, about 50 nm, for example. Flow amount of hydrogen is adjusted to 200 sccm/min, for example, flow amount of silane is adjusted to 2.0 sccm/min (100% silane is used), and flow amount of ammonium is adjusted to 200 sccm/min. Interior pressure of the growth chamber 1 is adjusted to, for example, 13.3 Pa. In this manner, the silicon nitride layer 15 grows to the thickness of 50 nm on the substrate 4, i.e. the single crystal silicon substrate, as shown in FIG. 20B. At the same time, as a result of nitrification of the surface of the catalyst 8 by ammonium, a WN film is formed.

After the growth of the silicon nitride layer 15, silane flow amount and ammonium flow amount to the growth chamber 1 are set to zero, and especially, silane and ammonium brought into the growth chamber 1 are discharged. It takes about five minutes for the discharge.

Subsequently, silane is supplied in addition to hydrogen from the gas supply pipe 3 into the growth chamber 1 to grow a silicon layer of a predetermined thickness, namely, about 40 nm, for example. Flow amount of hydrogen is adjusted to 200 scam/min, for example, and flow amount of silane is adjusted to 2.0 sccm/min (100% silane is used). Interior pressure of the growth chamber 1 is adjusted to, for example, 0.13 Pa (1.0 mTorr). In this manner, the polycrystalline silicon layer 10 grows on the silicon nitride layer 15 as shown in FIG. 20B.

After the growth of the polycrystalline silicon layer 10, silane flow amount to the growth chamber 1 is set to zero, and about five minutes later, for example, the power supply to the catalyst 8 is interrupted to lower its temperature.

Subsequently, hydrogen flow amount to the growth chamber 1 is set to zero, and the pressure is reduced to about (1~2)×10⁻⁶ Pa. Particularly, silane introduced into the growth chamber 1 is discharged. It takes about five minutes for-this discharge.

Thereafter, the substrate 4 having the silicon nitride layer 15 and the polycrystalline silicon layer 10 grown thereon is removed externally from the growth chamber 1 via a loadlock chamber, not shown.

As explained above, according to the fifth embodiment, since the polycrystalline silicon layer is grown by nitrifying the surface of the catalyst 8 made of tungsten during growth of the silicon nitride layer 15 and next using the catalyst 8, concentration of metal impurities contained in the polycrystalline silicon layer can be reduced significantly to a value much smaller than conventional values by several digits. Therefore, it is possible to obtain a polycrystalline silicon layer having a higher electrical property, especially in electron mobility, as compared with polycrystalline silicon layers grown by conventional catalytic CVD.

In addition, since the growth pressure for growing the polycrystalline silicon layer by catalytic CVD is adjusted to 0.13 Pa (1.0 mTorr), it is possible to grow a polycrystalline silicon layer of a low oxygen concentration in which the maximum oxygen concentration is not higher than $5\times10^{18}$ atoms/cc at least in its region 10 nm deep, or 50 nm deep, depending on the case, or even 100 nm deep from the boundary with the substrate 4. This polycrystalline silicon layer is a high-quality polycrystalline silicon layer excellent in surface morphology, crystal grain size, oxygen concentration, exfoliation property and crystallization ratio that are requirements for use in TFT. More specifically, it is possible to grow a polycrystalline silicon layer, for example, which has a smooth surface, crystal grain size not smaller than 5 nm, oxygen concentration not higher than 0.001 atomic %, unlikeliness to exfoliate from the base and crystallization ratio not lower than 85%.

Furthermore, since catalytic CVD is used for growth of the polycrystalline silicon layer, reaction efficiency of reaction gas, such as silane, is as high as tens %. Therefore, it contributes to saving resources, decreases the load to the environment, and can reduce the growth cost.

Next explained is a method of growing a single crystal silicon layer by catalytic CVD according to the sixth embodiment of the invention. In the sixth embodiment, a single crystal silicon layer is epitaxially grown after a WN film is made by nitrifying the surface of the catalyst 8 made of W wire immediately before the growth.

More specifically, in the sixth embodiment, surface nitrification of the catalyst 8 is first conducted in the following process in the growth chamber 1 of the catalytic CVD apparatus shown in FIG. 1.

The interior of the growth chamber 1 is reduced in pressure to about $(1\sim2)\times10^6$ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Specifically, the susceptor temperature of the sample holder portion 5 may be adjusted to 350° C., hydrogen flow rate to 100 sccm/min, and pressure in the growth chamber 1 to 6.7 Pa (50 mTorr).

After that, the catalyst 8 is electrically charged and heated to a temperature in the range from 1800° C. to 2100° C. (for example, 2000° C.), and it is maintained at this temperature for a predetermined length of time (for example five minutes). The reason why hydrogen is kept flowing into the growth chamber 1 as mentioned above lies in preventing oxidation of the catalyst 8 during heating.

After that, ammonium is supplied in addition to hydrogen from the gas supply pipe 3 into the growth chamber 1 under controlled values of flow rate and pressure. More specifically, for example, the susceptor temperature of the sample holder portion 5 is adjusted to 350° C., flow rate of hydrogen to 100 sccm/min, flow rate of ammonium to 100 sccm/min, and pressure in the growth chamber 1 to 1.33~13.3 Pa (10~100 mTorr), and these conditions are maintained for a length of time required (for example, for 30 minutes). As a result, as shown in FIG. 4, surface of the catalyst 8 is nitrified, and the WN film 85 is formed.

Subsequently, ammonium flow amount to the growth chamber 1 is set to zero, and power supply to the catalyst 8 is interrupted for five minutes, for example, to lower its temperature.

Thereafter, hydrogen flow rate is adjusted to zero, and the pressure is reduced to about $(1\sim2)\times^{-6}$ Pa. Particularly, ammonium introduced into the growth chamber 1 is discharged. It takes about 5 minutes for this discharge.

Through these procedures, surface nitrification of the catalyst 8 is completed.

Next started is the epitaxial growth of a single crystal silicon layer in the following process.

Figure 21A:
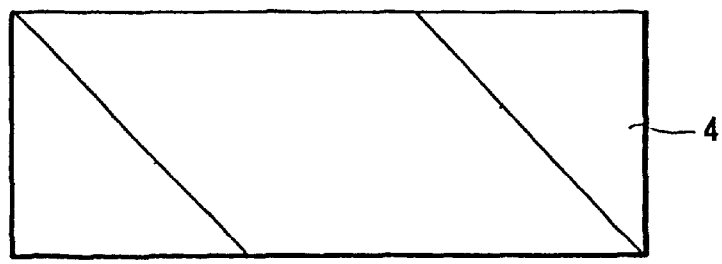
FIGS. 21A and 21B are cross-sectional views for explaining a method of growing a polycrystalline silicon layer by catalytic CVD according to the fourth embodiment of the invention.

That is, as shown in FIG. 21A, first prepared is a single crystal silicon substrate as the substrate 4. The single crystal silicon substrate next undergoes washing, removal of a thin oxide film from the surface with diluted hydrofluoric acid (1~5% water solution), washing with pure water, and subsequent drying.

After that, the single crystal silicon substrate is mounted to the susceptor of the sample holder portion 5 inside the growth chamber 1 of the catalytic CVD apparatus shown in FIG. 1 through a loadlock chamber, not shown. The susceptor of the sample holder portion 5 is previously adjusted to the growth temperature by the heater 6.

After that, interior pressure of the growth chamber 1 is reduced to about $(1\sim2)\times10^{-6}$ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Interior pressure of the growth chamber 1 is adjusted to, for example, 0.13 Pa (1 mTorr). Hydrogen flow rate is adjusted to 30 sccm/min.

Subsequently, the catalyst 8 is electrically charged and heated to 1800° C., and maintained at the temperature for 10 minutes, for example.

Figure 21B:
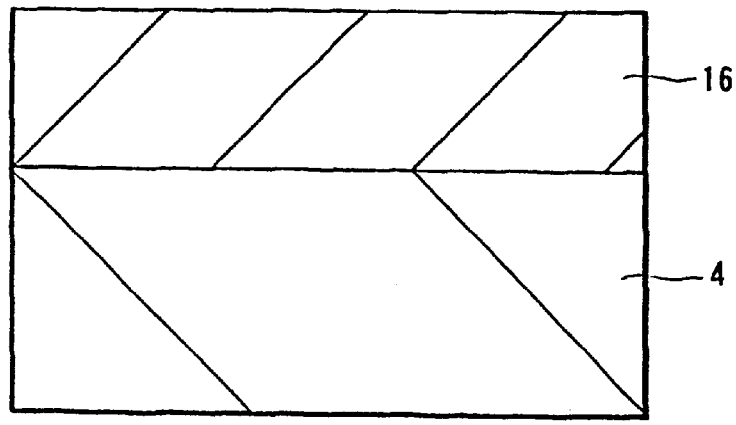

Subsequently, silane is supplied in addition to hydrogen from the gas supply pipe 3 into the growth chamber 1 to grow a silicon nitride layer of a predetermined thickness, namely, about 0.5 μm, for example. Flow amount of hydrogen is adjusted to 30 sccm/min, for example, and flow amount of silane is adjusted to 0.3~2 sccm/min (100% silane is used). In this manner, the silicon nitride layer 16 epitaxially grows on the substrate 4, i.e. the single crystal silicon substrate, as shown in FIG. 21B.

After the growth, silane flow amount to the growth chamber 1 is set to zero, and about five minutes later, for example, power supply to the catalyst 8 is interrupted to lower its temperature.

Subsequently, hydrogen flow amount to the growth chamber 1 is set to zero, and the pressure is reduced to about $(1\sim2)\times10^6$ Pa. Particularly, silane introduced into the growth chamber 1 is discharged. It takes about five minutes for this discharge.

Thereafter, the single crystal silicon substrate 4 having the single crystal silicon layer 16 grown thereon is removed externally from the growth chamber 1 via a loadlock chamber, not shown.

As explained above, according to the sixth embodiment, since the single crystal silicon layer is epitaxially grown by catalytic CVD using the catalyst 8 having the WN film made by nitrifying the surface of W wire, concentration of metal impurities contained in the single crystal silicon layer can be reduced remarkably. Therefore, it is possible to obtain a single crystal silicon layer having a higher electrical property, especially in electron mobility.

In addition, since the growth pressure for growing the single crystal silicon layer by catalytic CVD is adjusted to 0.13 Pa (1 mTorr), it is possible to epitaxially grow a single crystal silicon layer of a low oxygen concentration in which the maximum oxygen concentration is not higher than $3 \times 10^{18}$ atoms/cc at least in its region 10 nm deep, or 50 nm deep, depending on the case, or even 100 nm deep from the boundary with the substrate 4. This single crystal silicon layer is a high-quality single crystal silicon layer excellent in crystalline property. Furthermore, since catalytic CVD is used for epitaxial growth of the single crystal silicon layer, reaction efficiency of reaction gas, such as silane, is as high as tens %. Therefore, it contributes to saving resources, decreases the load to the environment, and can reduce the growth cost.

Moreover, since the single crystal silicon layer can be epitaxially grown at a temperature in the range from 200° C. to 600° C., in case the single crystal silicon layer is epitaxially grown on a single crystal silicon substrate having a high impurity concentration, for example, so-called auto doping can be prevented. As a result, controllability of the single crystal silicon layer, either in impurity concentration or thickness, can be improved. Furthermore, especially when the single crystal silicon layer is epitaxially grown on a sapphire substrate, thermal strain can be alleviated, and auto doping of aluminum from the sapphire substrate can be prevented substantially completely.

Further, since the growth temperature may be as low as 200° C. to 600° C. as explained above, small-power heating source can be used for the epitaxial growth apparatus. Therefore, the cooling mechanism is also simplified, and an inexpensive epitaxial growth apparatus can be made.

Next explained is a method of growing a single crystal silicon layer by catalytic CVD according to the seventh embodiment of the invention. In the seventh embodiment, a single crystal silicon layer is epitaxially grown after a WN film is made by nitrifying the surface of the catalyst 8 made of W wire immediately before the growth.

That is, in the seventh embodiment, as shown in FIG. 21A, first prepared is a single crystal silicon substrate as the substrate 4. The single crystal silicon substrate next undergoes washing, removal of a thin oxide film from the surface with diluted hydrofluoric acid (1~5% water solution), washing with pure water, and subsequent drying.

After that, the single crystal silicon substrate is mounted to the susceptor of the sample holder portion 5 inside the growth chamber 1 of the catalytic CVD apparatus shown in FIG. 1 through a loadlock chamber, not shown. The susceptor of the sample holder portion 5 is previously adjusted to the growth temperature by the heater 6.

After that, interior pressure of the growth chamber 1 is reduced to about $(1\sim2) \times 10^{-6}$ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Specifically, for example, susceptor temperature of the sample holder portion 5 is adjusted to 350° C., hydrogen flow rate to 200 sccm/min, and interior pressure of the growth chamber 1 to 6.7 Pa (50 mTorr).

Subsequently, in this hydrogen atmosphere, the catalyst 8 made of W is electrically charged and heated. When the temperature exceeds 1000° C., ammonium is supplied in addition to hydrogen by the flow rate of, for example, 200 sccm/min from the gas supply pipe 3 into the growth chamber 1 while continuously electrically charging the catalyst 8 to heat it to 1700° C. Interior pressure of the growth chamber 1 is adjusted to 1.33 Pa (10 mTorr), for example. The catalyst 8 is maintained in these conditions for 10 minutes, for example. As a result, as shown in FIG. 4, the surface of the catalyst 8 is nitrified, and the WN film 85 is formed.

After that, ammonium flow amount to the growth chamber 1 is set to zero, and about 3 to 5 minutes later, for example, the power supply to the catalyst 8 is interrupted to lower its temperature. Interior pressure of the growth chamber 1 is adjusted to, for example, 0.13 Pa (1 mTorr). Hydrogen flow rate is adjusted to 30 sccm/min.

Thereafter, the catalyst 8 whose surface has been nitrified by the foregoing nitrification is electrically charged and heated to 1700° C., and maintained at this temperature for 10 minutes, for example. The reason why hydrogen is supplied to the growth chamber as explained above lies in preventing oxidation of the catalyst 8 when heated.

Subsequently, silane is supplied in addition to hydrogen from the gas supply pipe 3 into the growth chamber 1 to grow a silicon layer of a predetermined thickness, namely, about 0.5 $\mu$m, for example. Flow amount of hydrogen is adjusted to 30 sccm/min, for example, and flow amount of silane is adjusted to a value in the range from 0.3 sccm/min to 2 sccm/min (100% silane is used). Interior pressure of the growth chamber 1 is adjusted to, for example, 0.13 Pa (1 mTorr). In this manner, the single crystal silicon layer 16 grows on the substrate 4, i.e. single crystal silicon substrate, as shown in FIG. 21B.

After the growth, silane flow amount to the growth chamber 1 is set to zero, and about 3 to 5 minutes later, for example, the power supply to the catalyst 8 is interrupted to lower its temperature.

Thereafter, hydrogen flow amount to the growth chamber 1 is set to zero, and the pressure is reduced to about $(1\sim2) \times 10^{-6}$ Pa. Particularly, silane introduced into the growth chamber 1 is discharged. It takes about 5 minutes for this discharge.

After that, the single crystal silicon substrate 4 having the single crystal silicon layer 16 grown thereon is removed externally from the growth chamber 1 via a loadlock chamber, not shown.

The seventh embodiment also ensures the same advantages as those of the sixth embodiment.

Next explained is a method of growing a single crystal silicon layer by catalytic CVD according to the eighth embodiment of the invention. In the eighth embodiment, a single crystal silicon layer is grown by using a catalyst 8 made of tungsten, which is prepared beforehand by forming a WN film on the surface of the catalyst by nitirification or deposition.

That is, as shown in FIG. 21A, first prepared is a single crystal silicon substrate as the substrate 4. The single crystal silicon substrate next undergoes washing, removal of a thin oxide film from the surface with diluted hydrofluoric acid (1~5% water solution), washing with pure water, and subsequent drying.

After that, the single crystal silicon substrate is mounted to the susceptor of the sample holder portion 5 inside the growth chamber 1 of the catalytic CVD apparatus shown in FIG. 1 through a loadlock chamber, not shown. The susceptor of the sample holder portion 5 is previously adjusted to the growth temperature by the heater 6.

After that, interior pressure of the growth chamber 1 is reduced to about $(1\sim2) \times 10^{-6}$ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Interior pressure of the growth chamber 1 is adjusted to, for example, 0.13 Pa (1 mTorr). Hydrogen flow rate is adjusted to 30 sccm/min.

Thereafter, the catalyst 8 whose surface has been nitrified by the foregoing nitrification is electrically charged and heated to 1700° C., and maintained at this temperature for 10 minutes, for example. The reason why hydrogen is supplied to the growth chamber as explained above lies in preventing oxidation of the catalyst 8 when heated.

Subsequently, silane is supplied in addition to hydrogen from the gas supply pipe 3 into the growth chamber 1 to grow a silicon layer of a predetermined thickness, namely, about 0.5 μm, for example. Flow amount of hydrogen is adjusted to 30 sccm/min, for example, and flow amount of silane is adjusted to a value in the range from 0.3 sccm/min to 2 sccm/min (100% silane is used). Interior pressure of the growth chamber 1 is adjusted to, for example, 0.13 Pa (1 mTorr). In this manner, the single crystal silicon layer 16 grows on the substrate 4, i.e. single crystal silicon substrate, as shown in FIG. 21B.

After the growth, silane flow amount to the growth chamber 1 is set to zero, and about 3 to 5 minutes later, for example, the power supply to the catalyst 8 is interrupted to lower its temperature.

Thereafter, hydrogen flow amount to the growth chamber 1 is set to zero, and the pressure is reduced to about $(1{\sim}2){\times}10^{-6}$ Pa. Particularly, silane introduced into the growth chamber 1 is discharged. It takes about 5 minutes for this discharge.

After that, the substrate 4 having the polycrystalline silicon layer 10 grown thereon is removed externally from the growth chamber 1 via a loadlock chamber, not shown.

The eighth embodiment also ensures the same advantages as those of the sixth embodiment.

Next explained is a method of growing a single crystal silicon layer by catalytic CVD according to the ninth embodiment of the invention. The ninth embodiment is the same as the sixth embodiment excepting that the growth pressure is adjusted to a higher value, i.e. 13.3 Pa (100 mTorr).

That is, in the ninth embodiment, surface nitrification of the catalyst 8 is first conducted in the following process in the growth chamber 1 of the catalytic CVD apparatus shown in FIG. 1.

The interior of the growth chamber 1 is reduced in pressure to about $(1{\sim}2){\times}10^{6}$ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Specifically, the susceptor temperature of the sample holder portion 5 may be adjusted to 350° C., hydrogen flow rate to 100 sccm/min, and pressure in the growth chamber 1 to 6.7 Pa (50 mTorr).

After that, the catalyst 8 is electrically charged and heated to a temperature in the range from 1800° C. to 2100° C. (for example, 2000° C.), and it is maintained at this temperature for a predetermined length of time (for example five minutes). The reason why hydrogen is supplied to the growth chamber as explained above lies in preventing oxidation of the catalyst 8 when heated.

After that, ammonium is supplied in addition to hydrogen from the gas supply pipe 3 into the growth chamber 1 under controlled values of flow rate and pressure. More specifically, for example, the susceptor temperature of the sample holder portion 5 is adjusted to 350° C., flow rate of hydrogen to 100 sccm/min, flow rate of ammonium to 100 sccm/min, and pressure in the growth chamber 1 to 1.33~13.3 Pa (10~100 mTorr), and these conditions are maintained for a length of time required (for example, for 30 minutes). As a result, as shown in FIG. 4, surface of the catalyst 8 is nitrified, and the WN film 85 is formed.

Subsequently, ammonium flow amount to the growth chamber 1 is set to zero, and power supply to the catalyst 8 is interrupted for five minutes, for example, to lower its temperature.

Thereafter, hydrogen flow rate is adjusted to zero, and the pressure is reduced to about $(1{\sim}2){\times}10^{-6}$ Pa. Particularly, ammonium introduced into the growth chamber 1 is discharged. It takes about 5 minutes for this discharge.

Through these procedures, surface nitrification of the catalyst 8 is completed.

Successively, as shown in FIG. 21A, first prepared is a single crystal silicon substrate as the substrate 4. The single crystal silicon substrate next undergoes washing, removal of a thin oxide film from the surface with diluted hydrofluoric acid (1~5% water solution), washing with pure water, and subsequent drying.

After that, the single crystal silicon substrate is mounted to the susceptor of the sample holder portion 5 inside the growth chamber 1 of the catalytic CVD apparatus shown in FIG. 1 through a loadlock chamber, not shown. The susceptor of the sample holder portion 5 is previously adjusted to the growth temperature by the heater 6.

After that, interior pressure of the growth chamber 1 is reduced to about $(1{\sim}2){\times}10^{-6}$ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Interior pressure of the growth chamber 1 is adjusted to, for example, 0.13 Pa (1 mTorr). Hydrogen flow rate is adjusted to 30 sccm/min.

Thereafter the catalyst is electrically charged and heated to 1800° C., and maintained at this temperature for 10 minutes, for example.

Subsequently, silane is supplied in addition to hydrogen from the gas supply pipe 3 into the growth chamber 1 to grow a silicon layer of a predetermined thickness, namely, about 0.5 μm, for example. Flow amount of hydrogen is adjusted to 30 sccm/min, for example, and flow amount of silane is adjusted to a value in the range from 0.3 sccm/min to 2 sccm/min (100% silane is used). Interior pressure of the growth chamber 1 is adjusted to, for example, 0.13 Pa (1 mTorr). In this manner, the single crystal silicon layer 16 grows on the substrate 4, i.e. single crystal silicon substrate, as shown in FIG. 21B.

After the growth, silane flow amount to the growth chamber 1 is set to zero, and about five minutes later, for example, the power supply to the catalyst 8 is interrupted to lower its temperature.

Thereafter, hydrogen flow amount to the growth chamber 1 is set to zero, and the pressure is reduced to about (1~2)×10⁻⁶ Pa. Particularly, silane introduced into the growth chamber 1 is discharged. It takes about 5 minutes for this discharge.

After that, the single crystal silicon substrate 4 having the single crystal silicon layer 16 grown thereon is removed externally from the growth chamber 1 via a loadlock chamber, not shown.

According to the ninth embodiment, since the single crystal silicon layer is epitaxially grown by catalytic CVD using the catalyst having the WN film made by nitrifying the surface of W wire, concentration of metal impurities contained in the single crystal silicon layer can be reduced significantly to a value much smaller than conventional values by several digits. Therefore, it is possible to obtain a single crystal silicon layer having a higher electrical property, especially in electron mobility, as compared with single crystal silicon layers grown by conventional catalytic CVD.

Heretofore, some embodiments of the invention have been explained. The invention, however, is not limited to those embodiments, but can be modified in various modes based on the technical concept of the invention.

That is, processes, numerical values, and substrate materials are not but mere examples, and if necessary, other appropriate processes, numerical values and substrate materials can be used alternatively. The catalytic CVD apparatus used in the first embodiment is also a mere example, and any other appropriate type of catalytic CVD apparatus can be used alternatively, and also regarding the catalyst, those made of elements other than W are also usable alternatively.

As explained above, according to the invention, at least the surface of the catalyst is made of a nitride or carbide to prevent vaporization of component elements or metal impurities from the catalyst when heated. Therefore, when a polycrystalline silicon layer or single crystal silicon layer is grown by catalytic CVD, it is effectively prevented that the growth layer incorporates these component elements or metal impurities therein as impurities. As a result, a polycrystalline silicon layer or single crystal silicon layer having a remarkably low metal impurity concentration can be grown.

In addition, growth is conducted by adjusting the total pressure of the growth atmosphere in the range from $1.33 \times 10^{-3}$ Pa to 4 Pa at least at the beginning of the growth, or adjusting the partial pressure of oxygen and moisture in the growth atmosphere in the range from $6.65 \times 10^{-10}$ Pa to $2 \times 10^{-6}$ Pa at least at the beginning of the growth, it is possible to epitaxially grow a high-quality polycrystalline silicon layer having an oxygen concentration not higher than $5 \times 10^{18}$ atoms/cm³ at least in its portion 10 nm deep from the boundary between the substrate and the polycrystalline silicon layer, or a high-quality single crystal silicon layer having an oxygen concentration not higher than $3 \times 10^{18}$ atoms/cm³ at least in its portion 10 nm deep from the boundary between the single crystal silicon layer and a material layer in lattice alignment with the single crystal silicon layer.

Having described specific preferred embodiments of the present invention with reference to the accompanying drawings, it is to be understood that the inventions is not limited to those precise embodiments, and that various changes and modifications may be effected therein by one skilled in the art without departing from the scope or the spirit of the invention as defined in the appended claims.

What is claimed is:

1. A polycrystalline silicon layer growth method for growing a polycrystalline silicon layer by catalytic CVD, characterized in:
    said polycrystalline silicon layer is grown by using a catalyst having a nitride formed at least on a surface of the catalyst.

2. The polycrystalline silicon layer growth method according to claim 1 wherein said nitride has a thickness not smaller than 1 nm.

3. The polycrystalline silicon layer growth method according to claim 1 wherein said nitride is formed by nitrifying the surface of the catalyst prior to growth of said polycrystalline silicon layer.

4. The polycrystalline silicon layer growth method according to claim 1 wherein said catalyst is made of tungsten, and tungsten nitride is formed as said nitride prior to growth of said polycrystalline silicon layer.

5. The polycrystalline silicon layer growth method according to claim 4 wherein nitrification of said catalyst is conducted by heating said catalyst made of tungsten to a temperature in a range from 800° C. to 2200° C. in a gas atmosphere containing nitrogen.

6. The polycrystalline silicon layer growth method according to claim 4 wherein nitrification of said catalyst is conducted by heating said catalyst made of tungsten to a temperature in the range from 1600° C. to 2100° C. in a gas atmosphere containing nitrogen.

7. The polycrystalline silicon layer growth method according to claim 1 wherein said catalyst is held in a hydrogen atmosphere when it is heated.

8. The polycrystalline silicon layer growth method according to claim 3 wherein said catalyst is held in a hydrogen atmosphere when it is heated.

9. The polycrystalline silicon layer growth method according to claim 4 wherein said catalyst made of tungsten is nitrified by first heating the tungsten to a first temperature in a range from 800° C. to 1600° C. in a hydrogen atmosphere and thereafter heating the tungsten to a second temperature higher than said first temperature in a second range from 900° C. to 2200° C. in a gas atmosphere containing nitrogen.

10. The polycrystalline silicon layer growth method according to claim 9 wherein said first temperature is in a range from 900° C. to 1100° C., and said second temperature is in the range from 1200° C. to 2200° C.

11. The polycrystalline silicon layer growth method according to claim 9 wherein said first temperature is in a range from 900° C. to 1100° C., and said second temperature is in a range from 1600° C. to 2100° C.

12. The polycrystalline silicon layer growth method according to claim 4 wherein a maximum tungsten concentration in said polycrystalline silicon layer is not higher than $5 \times 10^{16}$ atoms/cm³.

13. The polycrystalline silicon layer growth method according to claim 1 wherein said nitride is formed by stacking the nitride on the surface of the catalyst.

14. The polycrystalline silicon layer growth method according to claim 1 wherein total pressure of a growth atmosphere is adjusted to a value in a range from $1.33 \times 10^{-3}$ Pa to 4 Pa at least at the beginning of growth.

15. The polycrystalline silicon layer growth method according to claim 1 wherein partial pressure of oxygen and moisture in a growth atmosphere is adjusted to a value in a range from $6.65 \times 10^{-10}$ Pa to $2 \times 10^{-6}$ Pa at least at the beginning of growth.

16. The polycrystalline silicon layer growth method according to claim 1 wherein a maximum oxygen concentration at least in a portion 10 nm deep from the boundary between said substrate and said polycrystalline silicon layer is not higher than $5 \times 10^{18}$ atoms/cm$^3$.

17. The polycrystalline silicon layer growth method according to claim 1 wherein a maximum oxygen concentration at least in a portion 10 nm deep from the boundary between said substrate and said polycrystalline silicon layer is not higher than $2.5 \times 10^{18}$ atoms/cm$^3$.

18. The polycrystalline silicon layer growth method according to claim 1 wherein a maximum oxygen concentration at least in a portion 50 nm deep from the boundary between said substrate and said polycrystalline silicon layer is not higher than $5 \times 10^{18}$ atoms/cm$^3$.

19. The polycrystalline silicon layer growth method according to claim 1 wherein a maximum oxygen concentration at least in a portion 100 nm deep from the boundary between said substrate and said polycrystalline silicon layer is not higher than $5 \times 10^{18}$ atoms/cm$^3$.

20. A single crystal silicon layer epitaxial growth method for epitaxially growing a single crystal silicon layer on a material layer in lattice alignment with the single crystal by catalytic CVD, characterized in:
said single crystal silicon layer is epitaxially grown by using a catalyst having a nitride that is formed at least on the surface of the catalyst.

21. The single crystal silicon layer epitaxial growth method according to claim 20 wherein said nitride has a thickness not smaller than 1 nm.

22. The single crystal silicon layer epitaxial growth method according to claim 20 wherein said nitride is formed by nitrifying the surface of the catalyst prior to growth of said single crystal silicon layer.

23. The single crystal silicon layer epitaxial growth method according to claim 20 wherein said catalyst is made of tungsten, and tungsten nitride is formed as said nitride prior to growth of said single crystal silicon layer.

24. The single crystal silicon layer epitaxial growth method according to claim 23 wherein nitrification of said catalyst is conducted by heating said catalyst made of tungsten to a temperature in the range from 800° C. to 2200° C. in a gas atmosphere containing nitrogen.

25. The single crystal silicon layer epitaxial growth method according to claim 23 wherein nitrification of said catalyst is conducted by heating said catalyst made of tungsten to a temperature in a range from 1600° C. to 2100° C. in a gas atmosphere containing nitrogen.

26. The single crystal silicon layer epitaxial growth method according to claim 20 wherein said catalyst is held in a hydrogen atmosphere when it is heated.

27. The single crystal silicon layer epitaxial growth method according to claim 23 wherein said catalyst is held in a hydrogen atmosphere when it is heated.

28. The single crystal silicon layer epitaxial growth method according to claim 23 wherein said catalyst made of tungsten is nitrified by first heating it to a first temperature in a range from 800° C. to –1600° C. in a hydrogen atmosphere and thereafter heating it to a second temperature higher than said first temperature in a range from 900° C. to 2200° C. in a gas atmosphere containing nitrogen.

29. The single crystal silicon layer epitaxial growth method according to claim 28 wherein said first temperature is in a range from 900° C. to 1100° C., and said second temperature is in a range from 1200° C. to 2200° C.

30. The single crystal silicon layer epitaxial growth method according to claim 28 wherein said first temperature is in a range from 900° C. to 1100° C., and said second temperature is in a range from 1600° C. to 2100° C.

31. The single crystal silicon layer epitaxial growth method according to claim 23 wherein a maximum tungsten concentration in said single crystal silicon layer is not higher than $5 \times 10^{16}$ atoms/cm$^3$.

32. The single crystal silicon layer epitaxial growth method according to claim 2C wherein said nitride is formed by stacking the nitride on the surface of the catalyst.

33. The single crystal silicon layer epitaxial growth method according to claim 20 wherein a total pressure of a growth atmosphere is adjusted to a value in a range from $1.33 \times 10^{-3}$ Pa to 4 Pa at least at the beginning of growth.

34. The single crystal silicon layer epitaxial growth method according to claim 20 wherein a partial pressure of oxygen and moisture in a growth atmosphere is adjusted to a value in the range from $6.65 \times 10^{-10}$ Pa to $2 \times 10^{-6}$ Pa at least at the beginning of growth.

35. The single crystal silicon layer epitaxial growth method according to claim 20 wherein a maximum oxygen concentration at least in a portion 10 nm deep from the boundary between said material layer and said single crystal silicon layer is not higher than $3 \times 10^{18}$ atoms/cm$^3$.

36. The single crystal silicon layer epitaxial growth method according to claim 20 wherein a maximum oxygen concentration at least in a portion 10 nm deep from the boundary between said material layer and said single crystal silicon layer is not higher than $2 \times 10^{18}$ atoms/cm$^3$.

37. The single crystal silicon layer epitaxial growth method according to claim 20 wherein a maximum oxygen concentration at least in a portion 50 nm deep from a boundary between said material layer and said single crystal silicon layer is not higher than $3 \times 10^{18}$ atoms/cm$^3$.

38. The single crystal silicon layer epitaxial growth method according to claim 20 wherein a maximum oxygen concentration at least in a portion 100 nm deep from the boundary between said material layer and said single crystal silicon layer is not higher than $3 \times 10^{18}$ atoms/cm$^3$.

39. The single crystal silicon layer epitaxial growth method according to claim 20 wherein a thickness of said single crystal silicon layer is not larger than 1 µm, and maximum oxygen concentration is not higher than $3 \times 10^{18}$ atoms/cm$^3$.

40. The single crystal silicon layer epitaxial growth method according to claim 39 wherein a thickness of said single crystal silicon layer is not larger than 100 nm.

41. The single crystal silicon layer epitaxial growth method according to claim 39 wherein a maximum oxygen concentration is not higher than $2 \times 10^{18}$ atoms/cm$^3$.

42. A catalytic CVD apparatus using a catalyst, characterized in:
said catalyst has a nitride at least on a surface thereof.

43. The catalytic CVD apparatus according to claim 42 wherein said nitride is formed by nitrifying at least the surface of said catalyst.

44. The catalytic CVD apparatus according to claim 42 wherein said nitride has a thickness not smaller than 1 nm.

45. The catalytic CVD apparatus according to claim 42 said nitride is formed by nitrifying the surface of the catalyst prior to conducting growth.

46. The catalytic CVD apparatus according to claim 42 wherein said catalyst is made of tungsten, and tungsten nitride is formed as said nitride prior to conducting growth.

47. The catalytic CVD apparatus according to claim 46, wherein nitrification of said catalyst is conducted by heating said catalyst made of tungsten to a temperature in a range from 800° C. to 2200° C. in a gas atmosphere containing nitrogen.

48. The catalytic CVD apparatus according to claim 46, wherein nitrification of said catalyst is conducted by heating said catalyst made of tungsten to a temperature in the range from 1600° C. to 2100° C. in a gas atmosphere containing nitrogen.

49. The catalytic CVD apparatus according to claim 42, wherein said catalyst is held in a hydrogen atmosphere when it is heated.

50. The catalytic CVD apparatus according to claim 45, wherein said catalyst is held in a hydrogen atmosphere when it is heated.

51. The catalytic CVD apparatus according to claim 46 wherein said catalyst made of tungsten is nitrified by first heating the catalyst to a first temperature in a range from 800° C. to 1600° C. in a hydrogen atmosphere and thereafter heating the catalyst to a second temperature higher than said first temperature in a range from 900° C. to 2200° C. in a gas atmosphere containing nitrogen.

52. The catalytic CVD apparatus according to claim 51 wherein said first temperature is in a range from 900° C. to 1100° C., and said second temperature is in a range from 1200° C. to 2200° C.

53. The catalytic CVD apparatus according to claim 51 wherein said first temperature is in a range from 900° C. to 1100° C., and said second temperature is in a range from 1600° C. to 2100° C.

54. The catalytic CVD apparatus according to claim 42 wherein said nitride is formed by making a film on the surface of said catalyst.

55. A polycrystalline silicon layer growth method for growing a polycrystalline silicon layer by catalytic CVD, characterized in:

said polycrystalline silicon layer is grown by using a catalyst having a carbide that is formed at least on a surface of the catalyst.

56. A single crystal silicon layer epitaxial growth method for epitaxially growing a single crystal silicon layer on a material layer in lattice alignment with the single crystal by catalytic CVD, characterized in:

said single crystal silicon layer is epitaxially grown by using a catalyst having a carbide that is formed at least on a surface of the catalyst.

57. A catalytic CVD apparatus using a catalyst, characterized in:

said catalyst has a carbide at least on a surface thereof.

* * * * *